(12) United States Patent
Liu et al.

(10) Patent No.: US 12,354,940 B2
(45) Date of Patent: Jul. 8, 2025

(54) REDISTRIBUTION LAYER STRUCTURE WITH SUPPORT FEATURES AND METHODS

(71) Applicant: Taiwan Semiconductor Manufacturing Company Ltd., Hsinchu (TW)

(72) Inventors: Monsen Liu, Hsinchu (TW); Shang-Lun Tsai, Hsinchu (TW); Shuo-Mao Chen, Hsinchu (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 530 days.

(21) Appl. No.: 17/832,374

(22) Filed: Jun. 3, 2022

(65) Prior Publication Data

US 2023/0395481 A1     Dec. 7, 2023

(51) Int. Cl.
*H01L 23/498* (2006.01)
*H01L 21/48* (2006.01)
*H01L 23/00* (2006.01)
*H01L 25/065* (2023.01)
*H01L 25/16* (2023.01)

(52) U.S. Cl.
CPC .... *H01L 23/49838* (2013.01); *H01L 21/4857* (2013.01); *H01L 21/486* (2013.01); *H01L 23/49816* (2013.01); *H01L 23/49822* (2013.01); *H01L 23/49833* (2013.01); *H01L 24/16* (2013.01); *H01L 24/32* (2013.01); *H01L 24/73* (2013.01); *H01L 25/0655* (2013.01); *H01L 25/162* (2013.01); *H01L 2224/16227* (2013.01); *H01L 2224/16238* (2013.01); *H01L 2224/32225* (2013.01); *H01L 2224/73104* (2013.01); *H01L 2924/1431* (2013.01); *H01L 2924/1436* (2013.01)

(58) Field of Classification Search
CPC ......... H01L 23/49838; H01L 23/49833; H01L 21/486; H01L 24/16; H01L 2924/1431
See application file for complete search history.

(56) References Cited

U.S. PATENT DOCUMENTS 9,236,267 B2     1/2016  De et al.
9,502,265 B1    11/2016  Jiang et al.
(Continued)

*Primary Examiner* — Walter H Swanson
*Assistant Examiner* — Jacob T Nelson
(74) *Attorney, Agent, or Firm* — Seed IP Law Group LLP

(57) ABSTRACT

A device includes a semiconductor chip and a redistribution layer (RDL) structure connected to the semiconductor chip. The redistribution layer structure comprises a first region including: a first bump connected to the semiconductor chip; a second bump; and a plurality of first redistribution layers connected between the first bump and the second bump. The RDL structure includes a second region laterally surrounding the first region, the second region including a plurality of second redistribution layers. The RDL structure includes an isolation region laterally separating the plurality of first redistribution layers from the plurality of second redistribution layer. The isolation region includes at least one region that is straight, continuous, extends from an upper surface of the redistribution layer structure to a lower surface of the first redistribution layer structure, and has at least a selected width.

20 Claims, 24 Drawing Sheets

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 2019/0131273 A1* | 5/2019 | Chen ........................ H01L 24/19 |
| 2022/0399286 A1* | 12/2022 | Kim ........................ H01L 24/20 |
| 2022/0415806 A1* | 12/2022 | Waidhas ............. H01L 23/5384 |

* cited by examiner

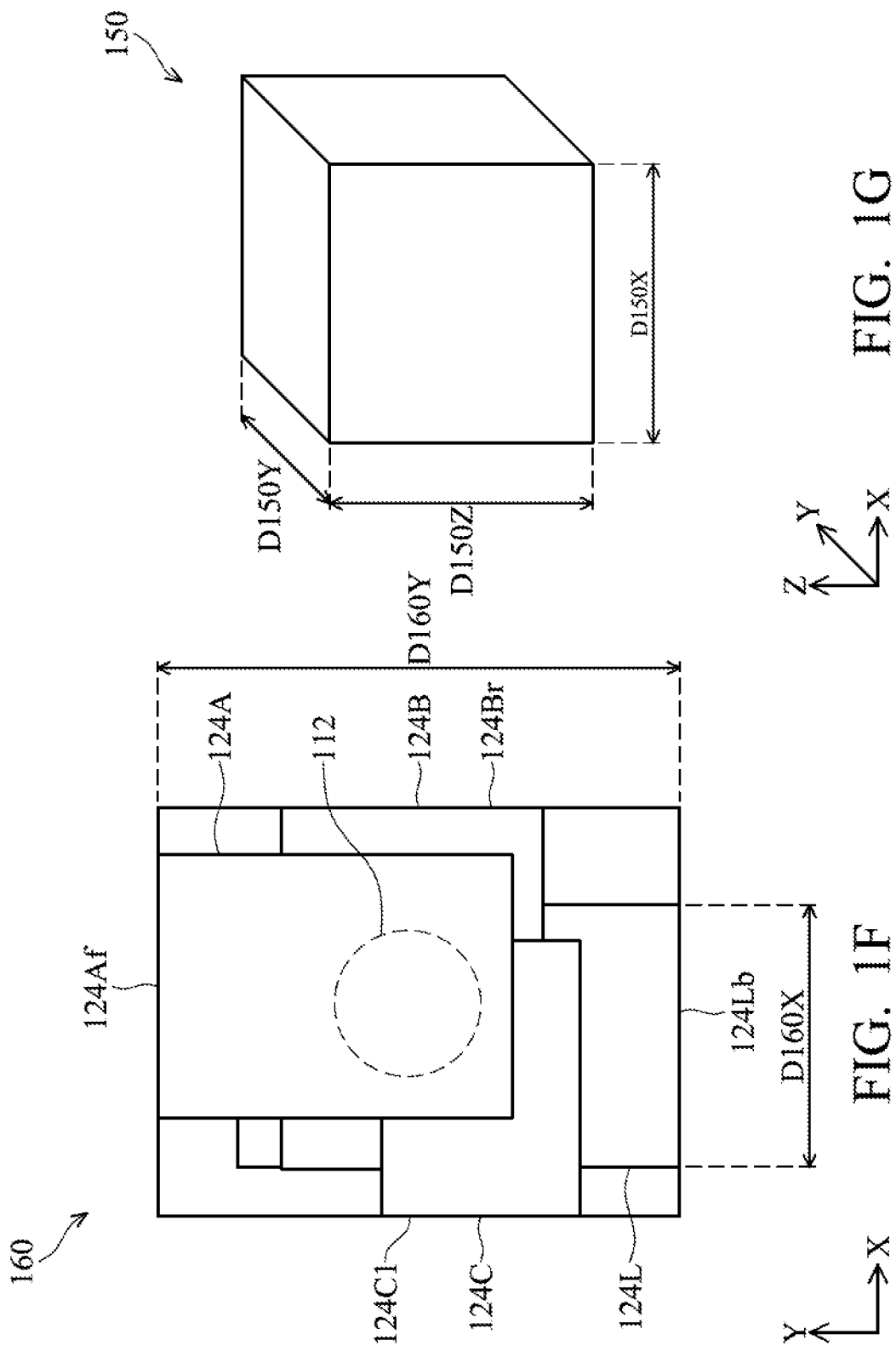

REDISTRIBUTION LAYER STRUCTURE WITH SUPPORT FEATURES AND METHODS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1H are views of a multi-chip wafer level package structure according to embodiments of the present disclosure.

DETAILED DESCRIPTION

Figure 1A:
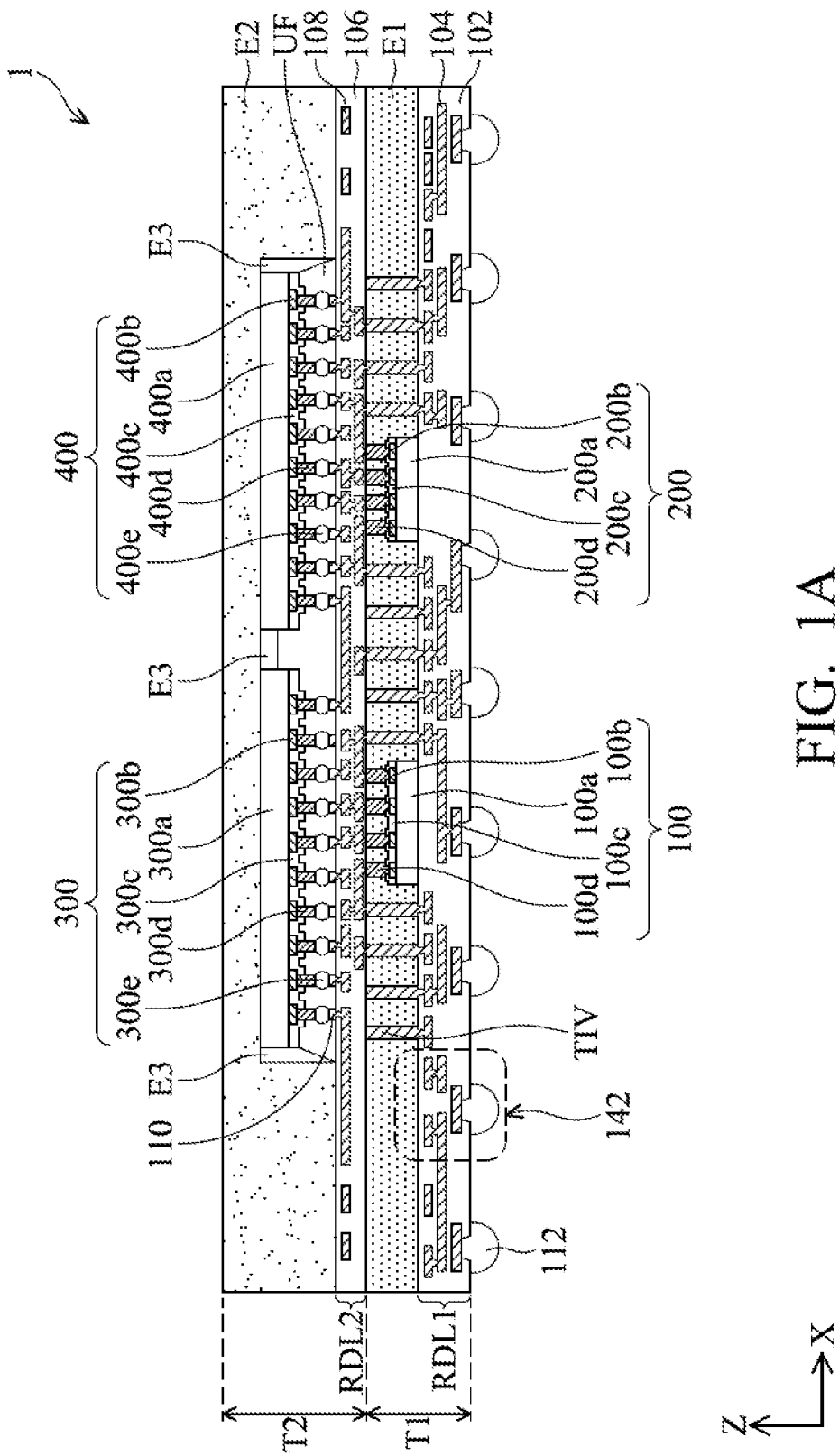

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

The present disclosure is related to redistribution layer structures for carrying high-frequency signals. Overlap between ground signal routing layers and high-frequency signal routing layers can lead to capacitive coupling that dramatically increases insertion loss at high frequencies. Embodiments of the disclosure position an isolation region between signal redistribution lines in a signal region and ground redistribution lines in a ground region. As such, capacitive coupling between the signal redistribution lines and the ground redistribution lines can be reduced or eliminated, which improves insertion loss at high frequencies. Positioning support structures in the isolation region and optionally in the signal region reduces process variation, such as sagging of polymer layers in which the signal and ground redistribution lines are embedded, without incurring a penalty to insertion loss.

FIG. 1A to FIG. 1E are cross-sectional views of multi-chip wafer level packages (WLPs) 1, 2 in accordance with some embodiments.

Referring to FIG. 1A, the multi-chip WLP 1 includes a first redistribution layer structure RDL1. The first redistribution layer structure RDL1 may also be referred to as a "backside redistribution layer structure" throughout the specification. In some embodiments, the first redistribution layer structure RDL1 includes a plurality of redistribution layers 104 embedded by a plurality of polymer layers 102. In some embodiments, the redistribution layers 104 include copper, nickel, titanium, a combination thereof, or the like, and are formed by photolithography, plating, and photoresist stripping processes. In some embodiments, each of the polymer layers 102 includes a polymer material such as polybenzoxazole (PBO), polyimide (PI), benzocyclobutene (BCB), a combination thereof or the like, and is formed by a suitable fabrication technique such as spin-coating, lamination, deposition or the like.

In some embodiments, through integrated fan-out vias TIV are formed on the first redistribution layer structure RDL1. The through integrated fan-out vias TIV may extend into the uppermost polymer layer 102 and are electrically connected to the uppermost redistribution layer 104. In some embodiments, the through integrated fan-out vias TIV include copper, nickel, titanium, a combination thereof, or the like, and are formed by photolithography, plating, and photoresist stripping processes.

A first semiconductor chip 100 and a second semiconductor chip 200 are placed on and bonded to a first side of the first redistribution layer structure RDL1. The first semiconductor chip 100 may include a substrate 100a, one or more pads 100b, a passivation layer 100c and one or more connectors 100d. The substrate 100a may include, for example, bulk silicon, doped or undoped, or an active layer of a semiconductor-on-insulator (SOI) substrate. The pads 100b are formed over the substrate 100a, and the passivation layer 100c is formed over the pads 100b. In some embodiments, the pads 100b are aluminum pads, and the passivation layer 100c includes a polymer material such as polybenzoxazole (PBO), polyimide, benzocyclobutene (BCB), a combination thereof, or the like. The connectors 100d are formed through the passivation layer 100c and electrically connected to underlying pads 100b or an interconnection structure. In some embodiments, the connectors 100d are formed as the top portions of the first semiconductor chip 100. The connectors 100d protrude from the remaining portions or lower portions of the first semiconductor chip 100. Throughout the description, the sides of the first semiconductor chip 100 with the connectors 100d may be referred to as front sides. The connectors 100d may include Cu, W, Ni, Sn, Ti, Au, an alloy or a combination thereof, and are formed with a ball drop process or an electroplating process. In some embodiments, the pads 100b constitute parts of the connectors of the first semiconductor chip 100. In some embodiments, the pads 100b and/or the connectors 100d constitute the front-side connectors of the first semiconductor chip 100.

The second semiconductor chip 200 includes one or more of a substrate 200a, one or more pads 200b, a passivation layer 200c and one or more connectors 200d. The materials and arrangements of other elements of the second semiconductor chip 200 may be similar to those of the first semiconductor chip 100, so the details are not iterated herein.

In some embodiments, each of the first and second semiconductor chips 100 and 200 includes an integrated passive device, such as a capacitor, an inductor or a resistor. The first and second semiconductor chips 100 and 200 may therefore be referred to as "first and second integrated passive device chips" in some parts of the specification. In some embodiments, each of the first and second semiconductor chips 100 and 200 is a capacitor configured to operate at a "high frequency," meaning about 1 gigahertz (GHz) or higher. As such, the first and second semiconductor chips 100 and 200 may be referred to as "high frequency capacitors" in other parts throughout the specification. In some embodiments, capacitors of the first and second semiconductor chips 100 and 200 are selected to have different capacitance values, different resonance frequencies, different sizes, or a combination thereof. However, the disclosure is not limited thereto. In some embodiments, the first and second semiconductor chips 100 and 200 are selected to have the same size, function, operation range, or combination thereof as would be beneficial to performance of the multi-chip WLP 1.

The first and second semiconductor chips 100 and 200 may be encapsulated with a first encapsulation layer E1. In some embodiments, the first encapsulation layer E1 encapsulates or surrounds the sidewalls of the through integrated fan-out vias TIV and the sidewalls of the first and second semiconductor chips 100 and 200. In some embodiments, the first encapsulation layer E1 includes a molding compound, a molding underfill, a resin or the like, such as epoxy. In some embodiments, the first encapsulation layer E1 includes a polymer material such as polybenzoxazole (PBO), polyimide, benzocyclobutene (BCB), a combination thereof, or the like, and is formed by a molding process followed by a grinding process until surfaces of the through integrated fan-out vias TIV and surfaces of the connectors 100d and 200d of the first and second semiconductor chips 100 and 200 are exposed.

A second redistribution layer structure RDL2 is positioned over the first encapsulation layer E1. The second redistribution layer structure RDL2 may also be referred to as a "front-side redistribution layer structure" in other parts throughout the specification. In some embodiments, the second redistribution layer structure RDL2 includes a plurality of redistribution layers 108 embedded by a plurality of polymer layers 106. In some embodiments, each of the redistribution layers 108 includes copper, nickel, titanium, a combination thereof, or the like, and is formed by photolithography, plating, and photoresist stripping processes. In some embodiments, each of the polymer layers 106 includes a polymer material such as polybenzoxazole (PBO), polyimide (PI), benzocyclobutene (BCB), a combination thereof or the like, and is formed by a suitable fabrication technique such as spin-coating, lamination, deposition or the like. In some embodiments, the second redistribution layer structure RDL2 further includes a plurality of connecting pads 110 configured to connect to other semiconductor chips.

In some embodiments, a smallest feature dimension (sometimes called a "critical dimension" or "CD") of the second redistribution layer structure RDL2 is less than a smallest feature dimension of the first redistribution layer structure RDL1. In alternative embodiments, the smallest feature dimension of the second redistribution layer structure RDL2 can be substantially the same as or greater than the smallest feature dimension of the first redistribution layer structure RDL1 as needed.

A third semiconductor chip 300 and a fourth semiconductor chip 400 may be positioned on and bonded to the second redistribution layer structure RDL2. In some embodiments, the third semiconductor chip 300 includes a one or more of a substrate 300a, one or more pads 300b, a passivation layer 300c, one or more connectors 300d, and one or more bumps 300e. The substrate 300a includes, for example, bulk silicon, doped or undoped, or an active layer of a semiconductor-on-insulator (SOI) substrate. The pads 300b are formed over the substrate 300a, and the passivation layer 300c is formed over the pads 300b. In some embodiments, the pads 300b are aluminum pads, and the passivation layer 300c includes a polymer material such as polybenzoxazole (PBO), polyimide, benzocyclobutene (BCB), a combination thereof, or the like. The connectors 300d are formed through the passivation layer 300c and electrically connected to underlying pads 300b or an interconnection structure. In some embodiments, the connectors 300d are formed as the top portions of the third semiconductor chip 300. The connectors 300d protrude from the remaining portions or lower portions of the third semiconductor chip 300. Throughout the description, the sides of the third semiconductor chip 300 with the connectors 300d are referred to as front sides. The connectors 300d may include copper-containing pillars, and are formed with an electroplating process. The bumps 300e are formed on the connectors 300d. In some embodiments, the bumps 300e may include solder bumps, and are formed with a ball drop process or an electroplating process. In some embodiments, the pads 300b and/or the bumps 300e constitute parts of the connectors of the third semiconductor chip 300. In some embodiments, the pads 300b, the connectors 300d and/or the bumps 300e constitute the front-side connectors of the third semiconductor chip 300.

In some embodiments, the fourth semiconductor chip 400 includes a substrate 400a, one or more pads 400b, a passivation layer 400c, one or more connectors 400d and one or more bumps 400e. The materials and element arrangements of the fourth semiconductor chip 400 may be substantially similar to those of the third semiconductor chip 300, so the details are not reiterated herein.

In some embodiments, each of the third and fourth semiconductor chips 300 and 400 includes an integrated active device, such as a logic device. The logic device may includes an application processor (AP), a system on a chip (SoC) or the like. In some embodiments, the system on a chip (SoC) includes a modem module. Other types of active devices such as memory devices, MOSFET devices, CMOS devices and/or BJT devices may be selected as beneficial to performance of the multi-chip WLP 1. In some embodiments, the third and fourth semiconductor chips 300 and 400 are referred to as "first and second integrated active device chips" through the specification. In some embodiments, the third and fourth semiconductor chips 300 and 400 are active devices having different functions, different sizes or both. In alternative embodiments, the third and fourth semiconductor chips 300 and 400 are selected to have the same size, function or both, as beneficial to the multi-chip WLP 1. In some embodiments, at least one of third semiconductor chip 300 or fourth semiconductor chip 400 is electrically connected to six or more integrated passive device chips to form a multiple chip module. Such an arrangement may be beneficial to increasing the bandwidth of products as well as reducing packaging size.

The third and fourth semiconductor chips 300 and 400 may be bonded to the second redistribution layer structure RDL2 and located above the first and second semiconductor chips 100 and 200. In some embodiments, the bumps 300e and 400e of the third and fourth semiconductor chips 300 and 400 are bonded to the connecting pads 110 of the second redistribution layer structure RDL2.

In some embodiments, the total number of the connectors 300d of the third semiconductor chip 300 and the connectors 400d of the fourth semiconductor chip 400 is greater than (e.g., at least two times, at least five times or at least eight times) the total number of the connectors 100d of the first semiconductor chip 100 and the connectors 200d of the second semiconductor chip 200.

An underfill layer UF is positioned in the space between the second redistribution layer structure RDL2 and each of the third and fourth semiconductor chips 300 and 400. In some embodiments, the underfill layer UF is formed to surround the connectors 300d and 400d and the bumps 300e and 400e. In some embodiments, the underfill layer UF includes a molding compound such as epoxy, and is formed using dispensing, injecting, and/or spraying techniques.

A second encapsulation layer E2 encapsulates the third and fourth semiconductor chips 300 and 400. In some embodiments, the second encapsulation layer E2 is positioned over the second redistribution layer structure RDL2 to encapsulate or surround the sidewalls and tops of the third and fourth semiconductor chips 300 and 400. In some embodiments, the second encapsulation layer E2 includes a molding compound, a molding underfill, a resin or the like, such as epoxy. In some embodiments, the second encapsulation layer E2 includes a polymer material such as polybenzoxazole (PBO), polyimide, benzocyclobutene (BCB), a combination thereof, or the like, and is formed by a molding process. In some embodiments, the first and second encapsulation layers E1 and E2 include the same material. In alternative embodiments, the second encapsulation layer E2 includes a material different from that of the first encapsulation layer E1.

The lowermost polymer layer 102 may include openings that expose the connecting pads or the lowermost redistribution layer 104 of the first redistribution layer structure RDL1. In some embodiments, the openings are formed by a laser drilling process, a dry etching process or a suitable patterning process. Bumps 112 are positioned over the second side of the first redistribution layer structure RDL1 and bonded to the connecting pads of the first redistribution layer structure RDL1. In some embodiments, the bumps 112 may be solder bumps, and/or may include metal pillars (e.g., copper pillars), solder caps formed on metal pillars, and/or the like. The bumps 112 may be formed by a suitable process such as evaporation, electroplating, ball drop, or screen printing.

In some embodiments, the multi-chip wafer level package 1 includes a first tier T1 and a second tier T2 in physical contact with each other. In some embodiments, the first tier T1 includes the first redistribution layer structure RDL1 and the first and second semiconductor chips 100 and 200 thereon, and the second tier T2 includes the second redistribution layer structure RDL2 and the third and fourth semiconductor chips 300 and 400 thereon.

The first and second semiconductor chips 100 and 200 may be decoupling capacitors selected to stabilize level voltages of the third and fourth semiconductor chips 300 and 400. Specifically, during the operation of circuits, power supply lines may supply transient currents with a relatively high intensity, which can result in voltage fluctuations on the power supply lines. In some embodiments, the decoupling capacitors (e.g., the first and second semiconductor chips 100 and 200) are disposed close to (e.g., correspondingly below) the active devices (e.g., the third and fourth semiconductor chips 300 and 400), and act as charge reservoirs that additionally supply currents to the active devices to prevent momentary drops in supply voltage.

Figure 1B:
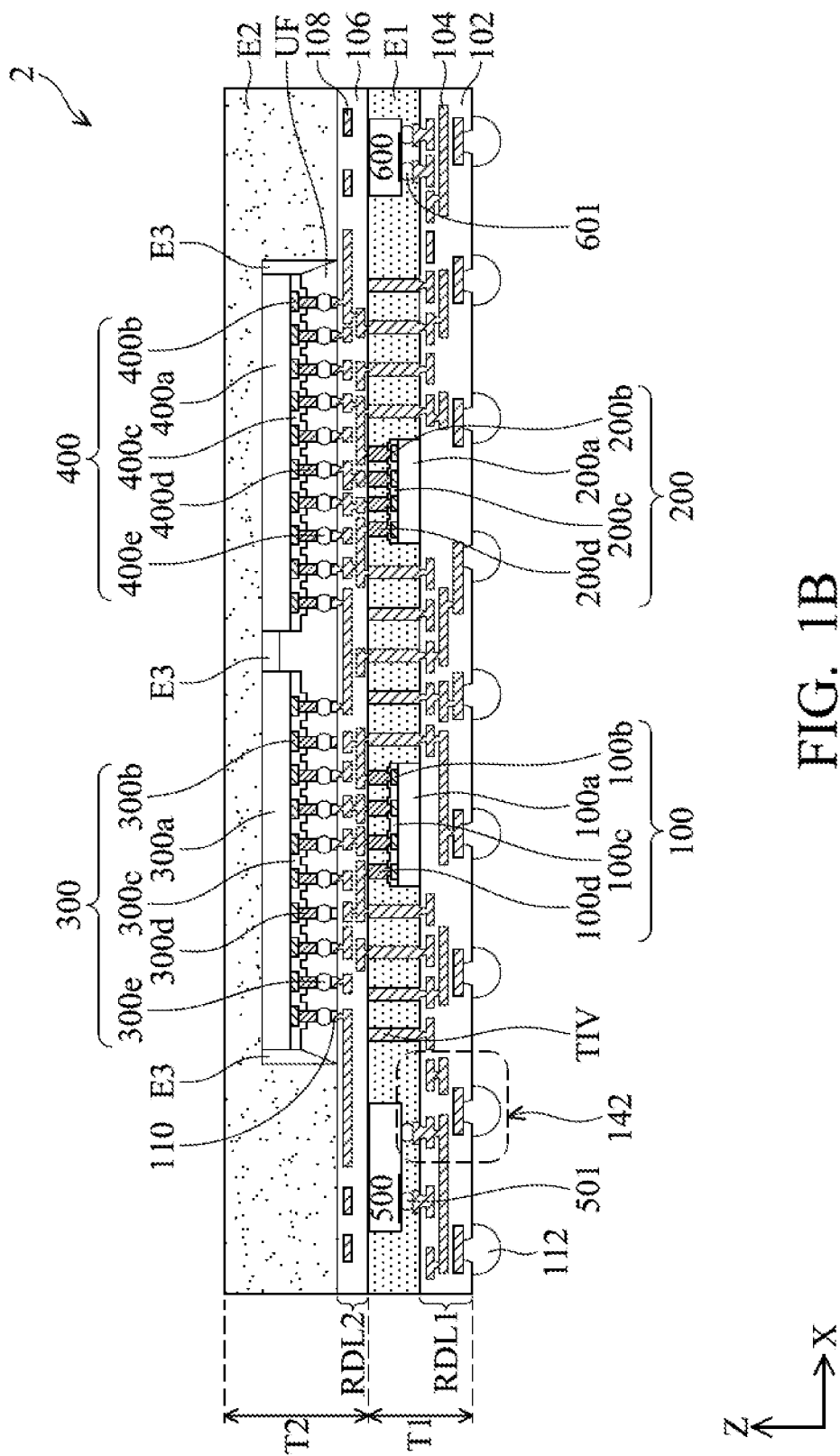

Possible modifications and alterations can be made to the multi-chip wafer level packages. These modifications and alterations are provided for illustration purposes, and are not construed as limiting the present disclosure. FIG. 1B, for example, is a cross-sectional view of a multi-chip wafer level package 2 in accordance with some embodiments.

The multi-chip wafer level package 2 of FIG. 1B is similar to the multi-chip wafer level package 1 of FIG. 1A in many respects, a difference between them being that, the multi-chip wafer level package 2 further includes a fifth semiconductor chip 500 and a sixth semiconductor chip 600, as shown. In some embodiments, each of the fifth and sixth semiconductor chips 500 and 600 includes an integrated passive device, such as a capacitor, an inductor or a resistor. As such, the fifth and sixth semiconductor chips 500 and 600 may be referred to as "third and fourth integrated passive device chips" in other parts throughout the specification. In some embodiments, each of the fifth and sixth semiconductor chips 500 and 600 is a capacitor configured to operate at a "low frequency," meaning about 1 KHz or less. As such, the fifth and sixth semiconductor chips 500 and 600 may be referred to as "low frequency capacitors" in other parts throughout the specification. In some embodiments, the fifth and sixth semiconductor chips 500 and 600 are capacitors selected to have different capacitance values, resonance frequencies, sizes, or combinations thereof. In some embodiments, the fifth and sixth semiconductor chips 500 and 600 are selected to have the same size, function, operation range or combination thereof, as is beneficial to performance of the multi-chip WLP 2. In some embodiments, when the first and second semiconductor chips 100 and 200 are placed on and bonded to the first redistribution layer structure RDL1, the fifth and sixth semiconductor chips 500 and 600 are placed on and bonded to the first redistribution layer structure RDL1 through the bumps 501 and 601 thereof.

In some embodiments, one or more of the fifth and sixth semiconductor chips 500 and 600 illustrated in FIG. 1B may be bonded to the second redistribution layer structure RDL2 instead of to the first redistribution layer RDL1. In some embodiments, when the third and fourth semiconductor chips 300 and 400 are placed on and bonded to the second redistribution layer structure RDL2, the fifth and sixth semiconductor chips 500 and 600 are placed on and bonded to the second redistribution layer structure RDL2 through the bumps 501 and 601 thereof.

Many of the components illustrated in FIG. 1B may be optional. In some embodiments, the first and second semiconductor chips 100, 200 are not present. In some embodiments, the third and fourth semiconductor chips 300, 400 are not present. In some embodiments, a wafer-level package may include the first redistribution layer structure RDL1, the bumps 112, and the fifth semiconductor chip 500, and the second redistribution layer structure RDL2 and the first, second, third and fourth semiconductor chips 100, 200, 300, 400 may not be present.

Figure 1C:
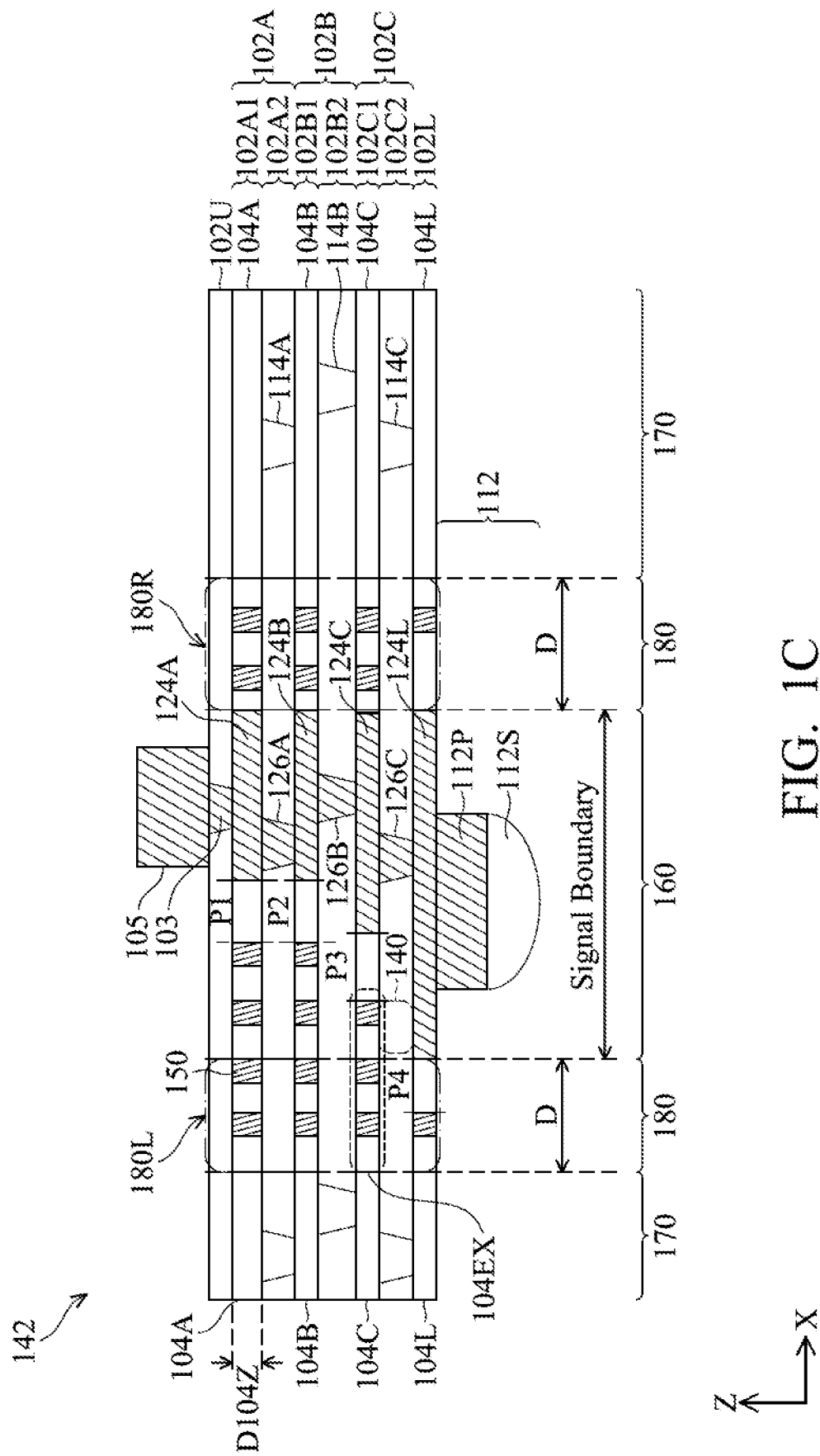
Figures 1D, 1E:
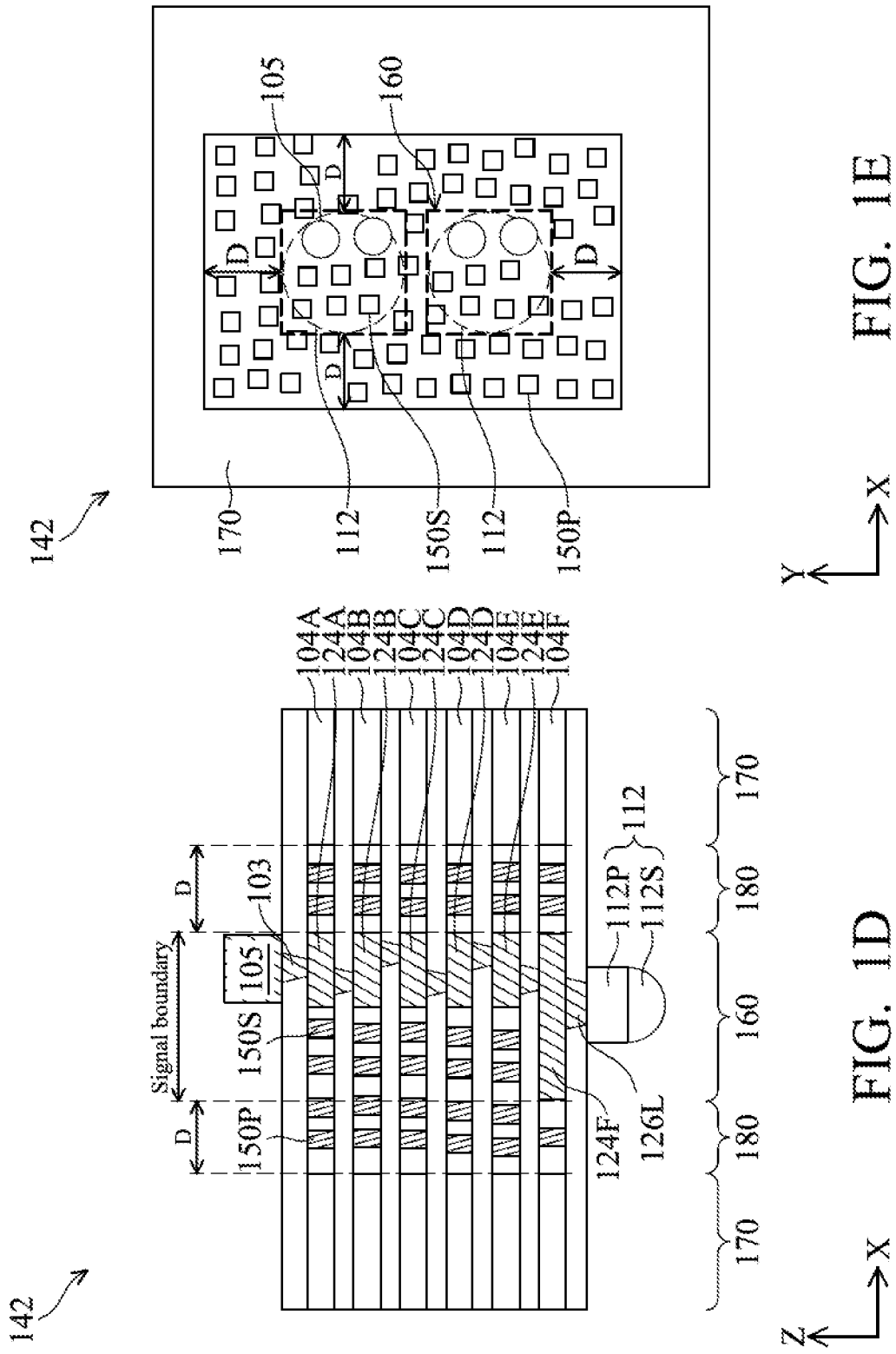

FIGS. 1C, 1D and 1E are cross-sectional views of a region 142 of the first redistribution layer structure RDL1 in accordance with various embodiments.

The first redistribution layer structure RDL1 includes a signal region 160, a ground region 170 and an isolation region 180. In some embodiments, the ground region 170 laterally surrounds the signal region 160, as shown in the top view of FIG. 1E. The isolation region 180 is between the signal region 160 and the ground region 170. The first redistribution layer structure RDL1 includes two or more redistribution layers (e.g., redistribution layers 104A, 104B, 104C, 104L) for interconnection between a top-side bump 105 (e.g., a microbump) and a bottom-side bump 112 (e.g., a controlled collapse chip connection, or "C4," bump).

The ground region 170 of the first redistribution layer structure RDL1 includes redistribution layers (or "ground redistribution layers") 104A, 104B, 104C, 104L and redistribution vias (or "ground redistribution vias") 114A, 114B, 114C vertically between the redistribution layers 104A, 104B, 104C, 104L. For example, the redistribution via 114A is between the redistribution layers 104A, 104B, as shown. The redistribution layers 104A, 104B, 104C, 104L are embedded in polymer layers 102A1, 102B1, 102C1, 102L, respectively. The redistribution vias 114A, 114B, 114C are embedded in polymer layers 102A2, 102B2, 102C2, respectively. Pairs of polymer layers, such as the polymer layers 102A1, 102A2 may be referred to collectively as, for example, the polymer layers 102A. The redistribution layers 104A, 104B, 104C, 104L are a grounding structure, in some embodiments. For example, the redistribution layers 104A, 104B, 104C, 104L may be electrically connected to a ground node of a system including the multi-chip WLP 1 or 2.

The signal region 160 of the first redistribution layer structure RDL1 includes signal redistribution lines 124A, 124B, 124C, 124L embedded in the polymer layers 102A1, 102B1, 102C1, 102L respectively. The signal region 160 includes signal vias 126A, 126B, 126C between the signal redistribution lines 124A, 124B, 124C, 124L and embedded in the polymer layers 102A2, 102B2, 102C2, respectively. A bump 105 is coupled to the signal redistribution layer 124A through connecting pad 103, as shown. The bump 105 may be connected to a semiconductor chip (e.g., the fifth semiconductor chip 500) that is above the first redistribution layer structure RDL1. In some embodiments, the bump 105 is connected to a TIV. The bump 105 may be a microbump, in some embodiments. A bump 112 is connected to the redistribution layer 124L, and includes a pad 112P and a solder region 112S. The bump 112 may be a controlled collapse chip connection (C4) bump, in some embodiments. The bump 112 may be connected to a substrate, such as a printed circuit board (PCB). Signal routing is present from the bump 105 to the bump 112 for electrical connection, e.g., between the fifth semiconductor chip 500 and the substrate. Although not shown in FIG. 1C, the ground region 170 including the redistribution layers 104A, 104B, 104C, 104L may be connected to a second microbump and a second C4 bump for electrical connection to the ground node.

The multi-chip WLP 1 or 2 may include one or more semiconductor chips (e.g., the fifth semiconductor chip 500 or the sixth semiconductor chip 600) that process (e.g., input, output or both) high frequency signals. For example, the fifth semiconductor chip 500 may include a serializer/deserializer (SERDES) input/output (I/O) circuit, a peripheral component interface express (PCIe) interface, or the like, which may operate at frequency around, or well in excess of, 0.1 GHZ, such as 16 GHz or 56 GHZ. Insertion loss at high frequencies may degrade performance of the multi-chip WLP 1 or 2. In FIG. 1C, the signal redistribution layers 124A, 124B, 124C, 124L carry signals at the high frequency. An extension region 104EX and a capacitance region 140 are illustrated in phantom. Were the redistribution line 104C to extend through the extension region 104EX, so as to overlap the redistribution line 124L in the signal region 160, capacitive coupling between the redistribution line 104C and the redistribution line 124L would be present in the capacitance region 140. The capacitive coupling would dramatically increase the insertion loss, degrading performance of the multi-chip WLP 1 or 2.

A signal boundary corresponds to a union in the top view of signal redistribution layers 124A, 124B, 124C, 124L from the bump 105, through the signal redistribution layers 124A, 124B, 124C, 124L, to the bump 112 (see FIG. 1F, for example). In some embodiments, no ground routing is present inside the signal boundary. A distance D is present between the signal boundary and the ground routing in the ground region 170. The redistribution lines 104A, 104B, 104C, 104L are separated from the signal redistribution lines 124A, 124B, 124C, 124L by the isolation region 180, which is free of the redistribution lines 104A, 104B, 104C, 104L and the signal redistribution lines 124A, 124B, 124C, 124L. Presence of the isolation region 180 is beneficial to reduce insertion loss in the first redistribution layer structure RDL1. In some embodiments, in a cross-sectional view (e.g., in the X-Z plane) along the vertical direction (e.g., the Z-axis direction), the isolation region 180 is or includes one or more regions (e.g., left and right regions 180L, 180R) that are straight, continuous, extend from the upper surface to the lower surface of the first redistribution layer structure RDL1, and have at least a selected width (e.g., the distance D). For example, the left region 180L has the width D, which is the lateral distance (e.g., in the X-axis direction) between the signal redistribution layer 124L and the redistribution layer 104L.

Referring to FIG. 1F, the signal region 160 is a rectangular region in the horizontal plane (e.g., the XY-plane) that is a union of the signal redistribution layers 124A, 124B, 124C, 124L. For example, the signal region 160 may have sides that are coplanar with a front side 124Af of the signal redistribution layer 124A, a right side 124Br of the signal redistribution layer 124B, a left side 124Cl of the signal redistribution layer 124C, and a back side 124Lb of the signal redistribution layer 124L. In some embodiments, the signal region 160 is square. The signal region 160 has width D160X in a first direction (e.g., the X-axis direction), and length D160Y in a second axis direction (e.g., the Y-axis direction) transverse the first direction. In some embodiments, the second axis direction is perpendicular to or substantially perpendicular to the first axis direction.

Referring again to FIG. 1C, due to absence of the redistribution layers 104A, 104B, 104C, 104L in the isolation region 180, and as some of the signal redistribution layers 124A, 124B, 124C, 124L do not fully extend across the signal region 160, sagging or "dishing" is likely between the redistribution layers 104A, 104B, 104C, 104L and the signal redistribution layers 124A, 124B, 124C, 124L. The sagging or dishing causes portions of the polymer layers 102A, 102B, 102C further from the redistribution layers 104A, 104B, 104C, 104L and the signal redistribution layers 124A, 124B, 124C, 124L to have reduced height relative to portions of the polymer layers 102A, 102B, 102C near the redistribution layers 104A, 104B, 104C, 104L and the signal redistribution layers 124A, 124B, 124C, 124L. As shown in FIG. 1C, support features 150 are positioned between the signal redistribution layers 124A, 124B, 124C, 124L and the redistribution layers 104A, 104B, 104C, 104L to improve metal density uniformity, which reduces the occurrence of sagging or dishing in the polymer layers 102A, 102B, 102C. The support features 150 may be electrically floating (e.g., not connected to a signal node, ground node, or other node). The support features 150 are positioned in the isolation region 180, and are optionally positioned in the signal region 160, as shown in FIG. 1C. The support features 150 may be or include metal, and may be referred to as metal features 150.

FIG. 1G is a perspective view of a support feature 150 in accordance with various embodiments. The support feature 150 may have width D150X in the first direction (e.g., the X-axis direction), length D150Y in the second direction (e.g., the Y-axis direction), and height D150Z in a third direction (e.g., the Z-axis direction). In some embodiments, the width D150X, the length D150Y and the height D150Z are the same or substantially the same as each other. In some embodiments, the width D150X is greater than or equal to about 0.4 times thickness D104Z (see FIG. 1C) of the redistribution layers 104A, 104B, 104C, 104L and less than or equal to ¼ the width D160X of the signal region 160 (see FIG. 1F). Less than about 0.4 times the thickness D104Z, the support features 150 may not provide sufficient support to the overlying polymer layer. Above about ¼ the width D160X of the signal region 160, the support features 150 cause signal interference with the high frequency signals carried by the signal redistribution layers 124A, 124B, 124C, 124L. In some embodiments, the length D150Y is the same as the width D150X. In some embodiments, the length D150Y is as much as three times the width D150X. It should be understood that the thickness D104Z may be different in each of the polymer layers 102A, 102B, 102C, 102L, such that the support features 150 in different polymer layers may have different widths D150X from each other.

Referring again to FIG. 1C, the isolation region 180 has width D, and includes the support features 150 in the polymer layers 102A1, 102B1, 102C1, 102L. In some embodiments, the support features 150 are vertically aligned (e.g., in the Z-axis direction), as shown. In some embodiments, the support features 150 are staggered along the vertical axis, such that vertically adjacent support features 150 are partially overlapping or do not overlap. In some embodiments, all of the support features 150 have substantially the same dimensions (e.g., width, length, and height) as each other. In some embodiments, one or more of the dimensions of one or more of the support features 150 are different from those of others of the support features 150. In some embodiments, support features 150 embedded in the same polymer layer (e.g., the polymer layer 102A1) are spaced evenly along the first direction (e.g., the X-axis direction). For example, a spacing P1, P2, P3, P4 may be present between the support features 150 adjacent the signal redistribution layers 124A, 124B, 124C, 124L and the signal redistribution layers 124A, 124B, 124C, 124L. In some embodiments, one or more of the support features 150 embedded in the same polymer layer are spaced unevenly from others of the support features 150.

FIGS. 1D and 1E are a cross-sectional side view and diagrammatic top view of the region 142 in accordance with various embodiments. FIG. 1D is similar in many respects to FIG. 1C, and description of similar features in both is not repeated for brevity.

In FIG. 1D, the first redistribution layer structure RDL1 includes the bump 112, six redistribution layers 104A, 104B, 104C, 104D, 104E, 104F, six signal redistribution layers 124A, 124B, 124C, 124D, 124E, 124F and the bump 105. In some embodiments, as shown, the pad 112P is coupled to the signal redistribution layer 124F by a signal via 126L instead of being directly coupled to the signal redistribution layer 124F. In some embodiments, the redistribution layers 104A, 104B, 104C, 104D, 104E, 104F all have inner sidewalls (e.g., sidewalls that face the signal region 160) that are coplanar with each other. The support features 150 include support features 150P in the isolation region 180 and optional support features 150S in the signal region 160.

In FIG. 1E, one or more (e.g., two) bumps 112 are laterally surrounded by the isolation region 180 and the ground region 170. Each of the bumps 112 is associated with (e.g., overlapped by) one or more bumps 105 and one or more support features 150S. The bumps 112 may be positive and negative terminals for input/output of differential signals, such as SERDES signals. Including two or more bumps 105 over each of the bumps 112 improves redundancy, such that even if one of the bumps 105 is defective, the other of the bumps 105 may be functional. As shown in FIG. 1E, the support features 150P, 150S may be distributed in an irregular manner throughout the plane (e.g., the XY-plane) of the isolation region 180 and the signal region 160. In some embodiments, the width D of the isolation region 180 is greater than the width D150X, the length D150Y, or both of the support features 150. In some embodiments, the width D is greater than about 1 micrometer, greater than about 10 micrometers, greater than about 30 micrometers, or another suitable dimension.

Figure 1H:
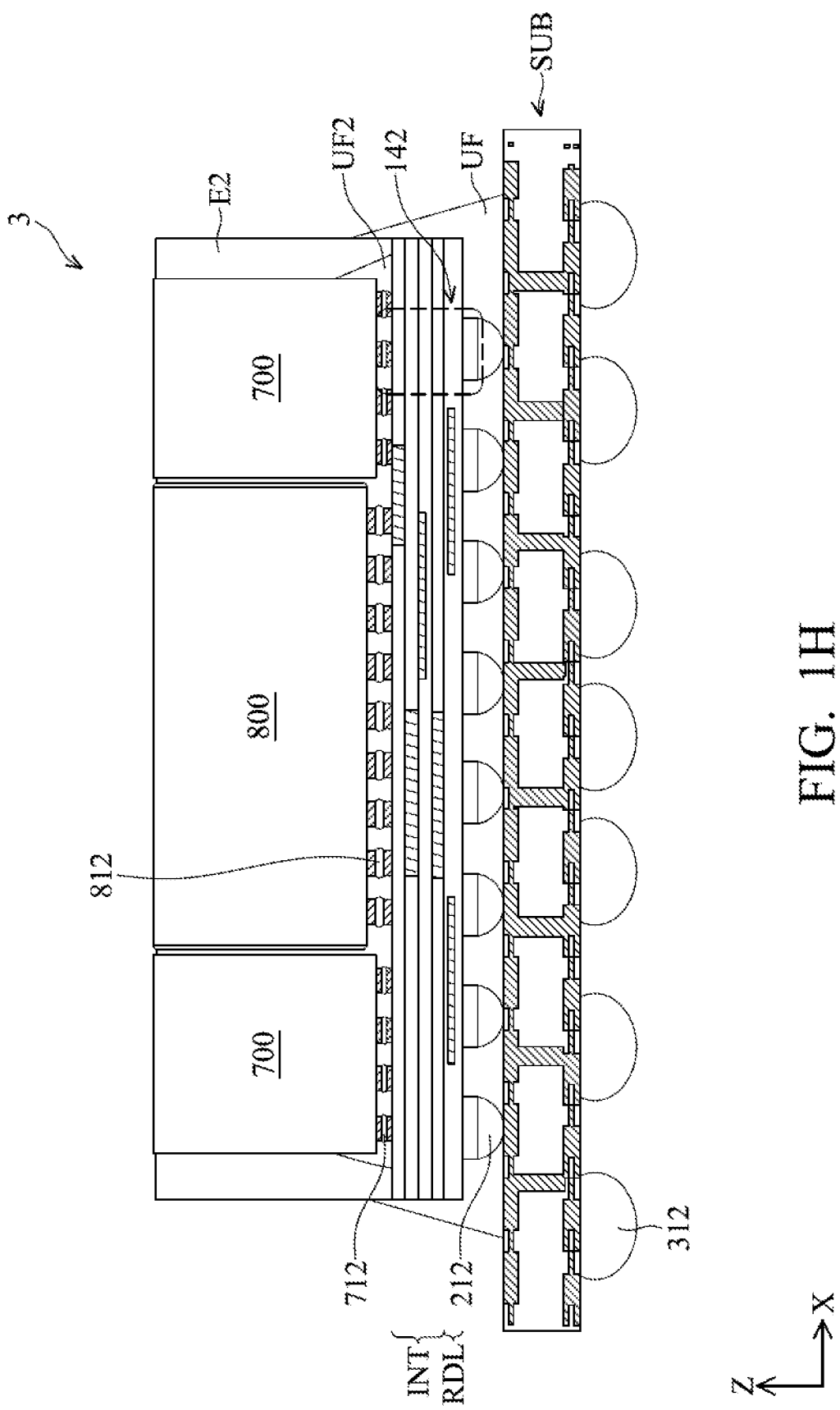

FIG. 1H is a diagram illustrating a multi-chip package 3 in a chip-on-wafer-on-substrate (CoWoS) configuration in accordance with some embodiments. In some embodiments, the multi-chip package 3 includes first die 800 and second dies 700. The first die 800 may be a logic integrated circuit (IC), such as a processor, application processing unit (APU), central processing unit (CPU), application-specific IC (ASIC), or other logic IC. One or more of the second dies 700 may be a memory die, such as a high-bandwidth memory (HBM) die, which may include a stack of memory dies, such as a stack of dynamic random access memory (DRAM) dies. The first die 800 is connected to an interposer INT by first connectors 812. The second dies 700 are connected to the interposer (or "interposer substrate") INT by second connectors 712. Electrical connection between the first and second dies 800, 700 may be present through electrical routing in the interposer INT. The interposer INT has a redistribution layer structure RDL thereon. The redistribution layer structure RDL is connected to a substrate (or "package substrate") SUB by third connectors 212. The substrate SUB is connected to fourth connectors 312, which may be used to make electrical connection with external electrical components. A second underfill UF2 may surround (e.g., laterally surround, partially laterally surround, or fully laterally surround) the first and second dies 800, 700, the first connectors 812 and the second connectors 712. As shown, the region 142 described with reference to FIGS. 1C-1G may encompass portions of the redistribution layer structure RDL and the interposer INT, such that one or more of the redistribution layers 104U, 104A, 104B, 104C, 104L (e.g., the redistribution layer 104U) may be a layer of the interposer INT. In embodiments in which one or more of the redistribution layers 104 is a layer of the interposer INT, the redistribution layer 104 may be a dielectric material different from that of others of the redistribution layers 104. For example, the layer of the interposer INT may be silicon dioxide, and the other layers of the redistribution layers 104 may be a polymer.

FIG. 2A to FIG. 2L are cross-sectional views of a method of forming a multi-chip wafer level package in accordance with various embodiments. FIG. 3 is a flowchart diagram of a method 3001 for forming a multi-chip WLP. In some embodiments, the method 3001 for forming the multi-chip WLP includes a number of operations (3000, 3100, 3200, 3300 and 3400). The method 3001 for forming the multi-chip WLP will be further described according to one or more embodiments. It should be noted that the operations of the method 3001 may be rearranged or otherwise modified within the scope of the various aspects. It should further be noted that additional processes may be provided before, during, and after the method 3001, and that some other processes may be only briefly described herein.

Figure 2A:
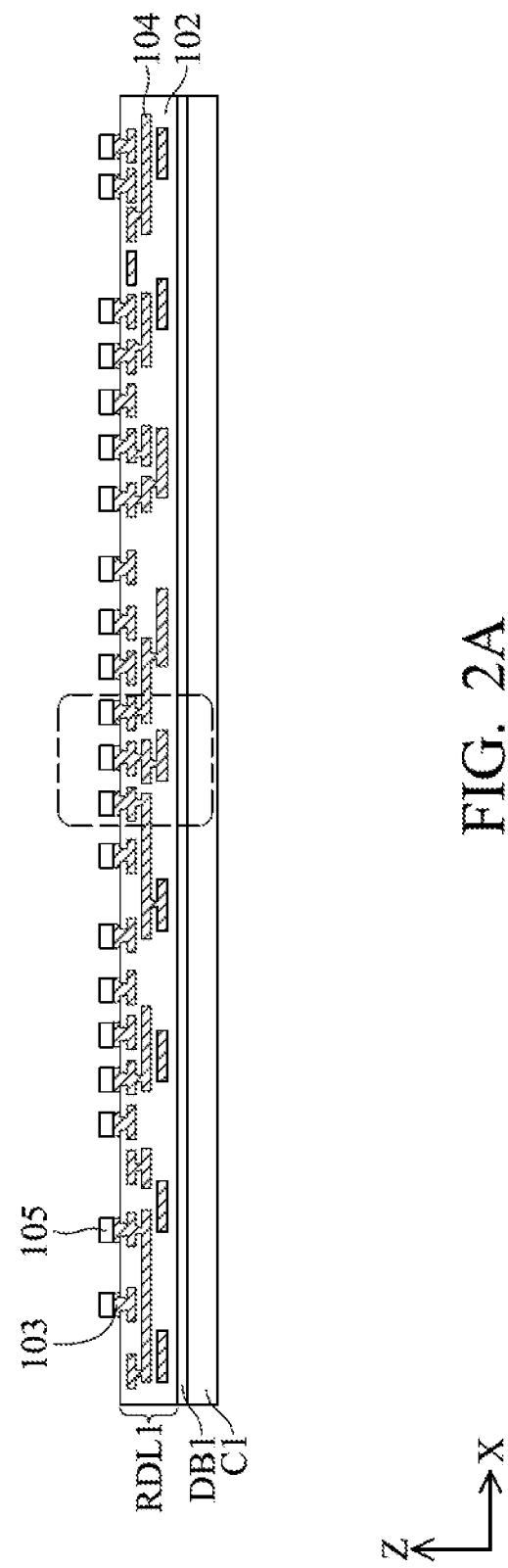
FIGS. 2A-2L are views of a multi-chip wafer level package at various stages of fabrication according to various embodiments of the present disclosure.

Referring to FIG. 2A, a first carrier C1 is provided with a first redistribution layer structure RDL1 formed thereon. In some embodiments, a first debonding layer DB1 is formed between the first carrier C1 and the first redistribution layer structure RDL1, corresponding to operation 3000 of FIG. 3. In some embodiments, the first carrier C1 is a non-semiconductor material, such as a glass carrier, a ceramic carrier, or the like. In some embodiments, the first debonding layer DB1 includes an Ultra-Violet (UV) glue, a Light-to-Heat Conversion (LTHC) glue, or the like, although other types of adhesives may be used. The first debonding layer DB1 is decomposable under the heat of light to thereby release the first carrier C1 from the structure formed thereon. In some embodiments, the first redistribution layer structure RDL1 includes a plurality of redistribution layers 104 embedded by a plurality of polymer layers 102. In some embodiments, the first redistribution layer structure RDL1 further includes a plurality of connecting pads 103 configured to connect to other semiconductor chips. In some embodiments, a plurality of bumps 105 are formed on the connecting pads 103 of the first redistribution layer structure RDL1. The bumps 105 may include solder bumps, and are formed with a ball drop process or an electroplating process. The first redistribution layer structure RDL1 may be formed by a process illustrated in FIGS. 2B, 2C, 2D, 2E and 2F, corresponding to operation 3100 of FIG. 3.

Figure 2B:
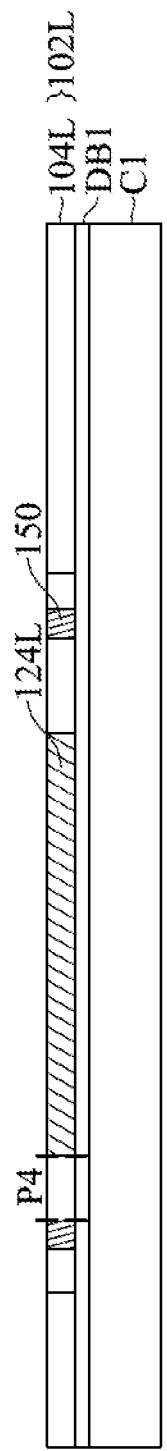
Figure 3:
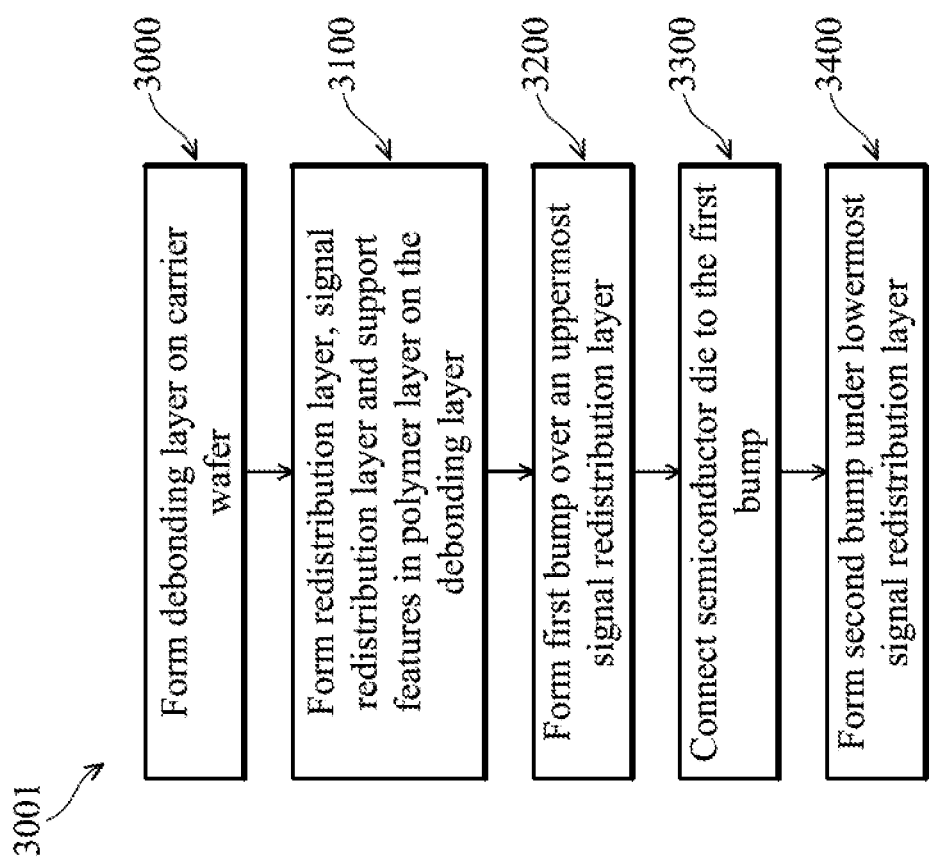
FIG. 3 is a view illustrating a method of forming a multi-chip wafer level package in accordance with various embodiments.

In FIG. 2B, the redistribution layer 104L, the signal redistribution layer 124L, and the support features 150 are formed in the polymer layer 102L. In some embodiments, the redistribution layer 104L includes copper, nickel, titanium, a combination thereof, or the like, and is formed by photolithography, plating, and photoresist stripping processes. In some embodiments, the polymer layer 102L includes a polymer material such as polybenzoxazole (PBO), polyimide (PI), benzocyclobutene (BCB), a combination thereof or the like, and is formed by a suitable fabrication technique such as spin-coating, lamination, deposition or the like. The redistribution layer 104L, the signal redistribution layer 124L, and the support features 150 are formed in the same process, in some embodiments. For example, openings for the redistribution layer 104L, the signal redistribution layer 124L, and the support features 150 may be formed in the same photolithography operation, then the redistribution layer 104L, the signal redistribution layer 124L, and the support features 150 may be formed in the openings in a single plating operation. As such, the redistribution layer 104L, the signal redistribution layer 124L, and the support features 150 may be the same material.

Figure 2C:
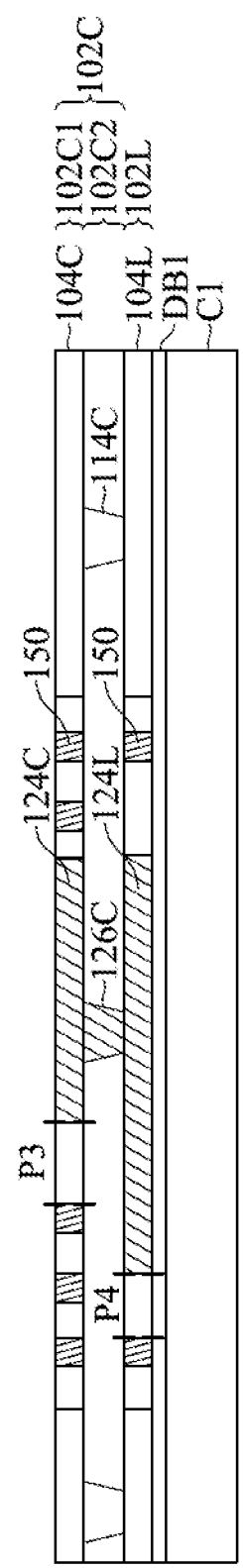

In FIG. 2C, the polymer layer 102C is formed, and the redistribution layer 104C, the redistribution vias 114C, the support features 150, the signal redistribution layer 124C and the signal via 126C are formed in the polymer layer 102C. In some embodiments, the polymer layer 102C2 is formed, then the polymer layer 102C1 is formed. In some embodiments, the polymer layer 102C2 and the polymer layer 102C1 are a single polymer layer 102C formed in a single formation process, such as a spin-coating, lamination, deposition or the like. The redistribution layer 104C and the signal redistribution layer 124C may be formed in a single damascene or dual damascene process. For example, the polymer layer 102C2 may be formed, openings may be formed in the polymer layer 102C2, the redistribution vias 114C and signal via 126C may be formed in the openings, then the polymer layer 102C1 may be formed, and the redistribution layer 104C, the signal redistribution layer 124C and the support features 150 may be formed in the polymer layer 102C1.

Figure 2D:
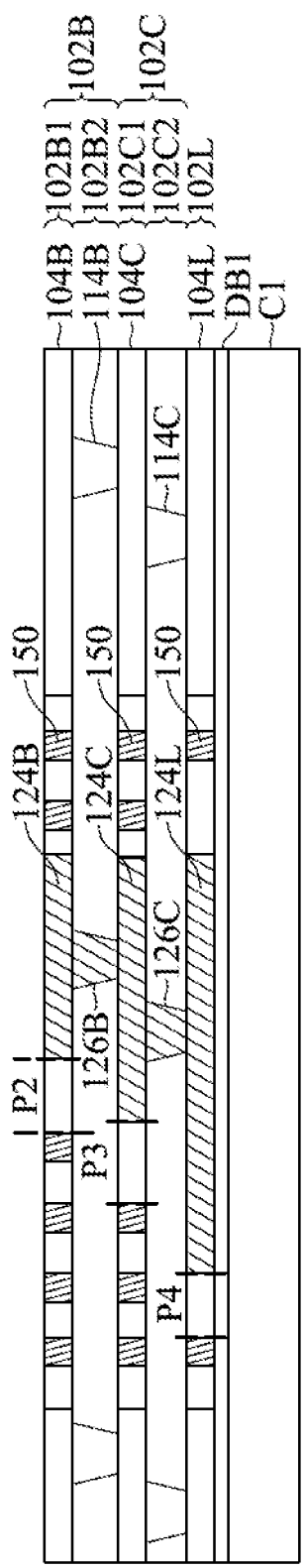
Figure 2E:
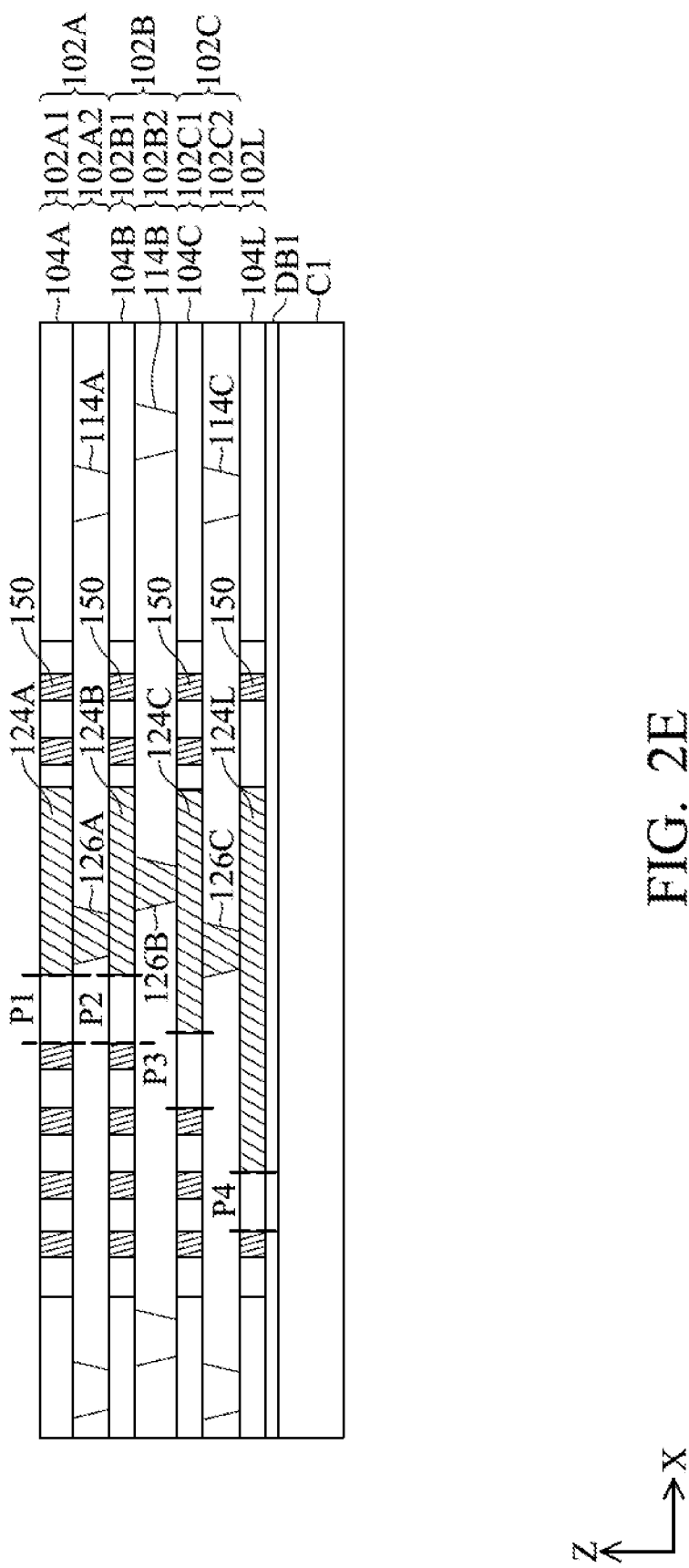

In FIG. 2D, following formation of the redistribution layer 104C, the redistribution vias 114C, the support features 150, the signal redistribution layer 124C and the signal via 126C embedded in the polymer layer 102C, the polymer layer 102B and the redistribution layer 104B, the signal redistribution layer 124B and the support features 150 are formed over the polymer layer 102C by a process similar to that described with reference to FIG. 2C. The same process may be repeated to form the polymer layer 102A and the redistribution layer 104A, the signal redistribution layer 124A and the support features 150 over the polymer layer 102B, as shown in FIG. 2E.

Figure 2F:
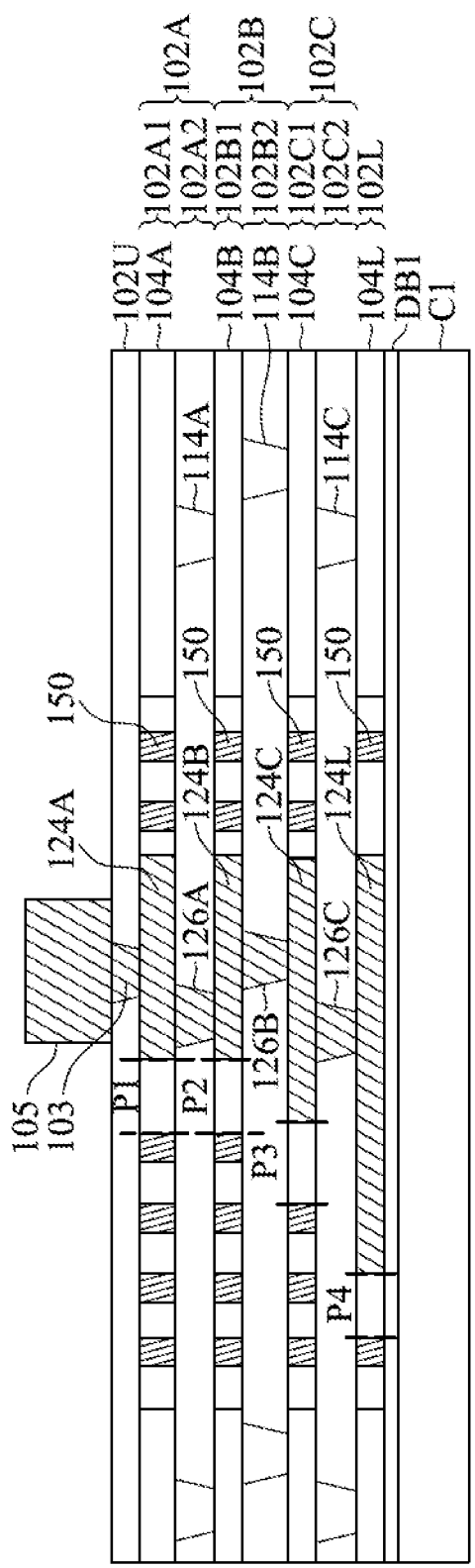

In FIG. 2F, the bump 105 may be formed following formation of the polymer layer 102A and the metal features embedded therein, corresponding to operation 3200 of FIG. 3. The polymer layer 102U may be formed over the polymer layer 102A. The pad 103 may be formed in the polymer layer 102U. Then, the bump 105 may be formed on the pad 103.

Figure 2G:
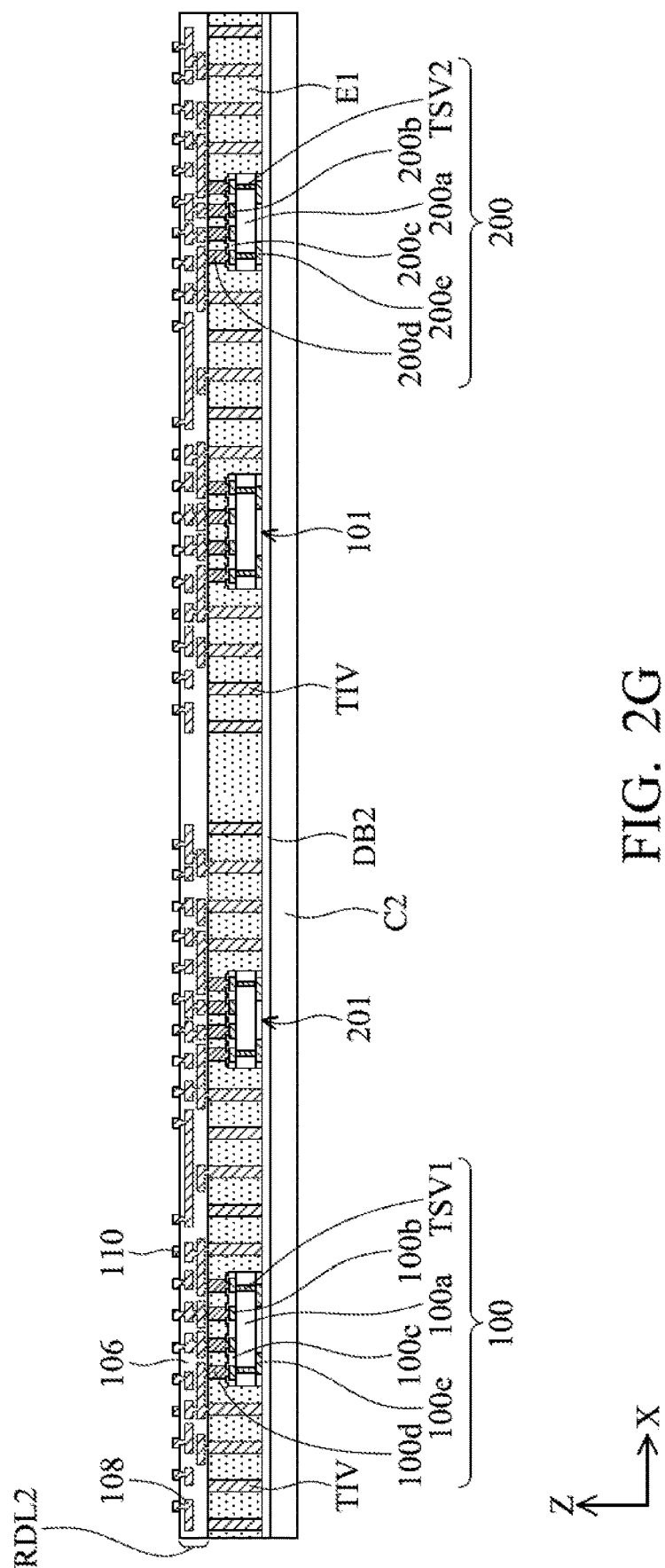

Thereafter, a chip module CM may be provided. In some embodiments, the chip module CM is formed by a method including operations illustrated in FIG. 2G to FIG. 2I. As shown in FIG. 2G, a second carrier C2 is provided with a second debonding layer DB2 formed thereon. Thereafter, a plurality of through integrated fan-out vias TIV are formed on the second debonding layer DB2. Afterwards, first and second semiconductor chips 101 and 201 are placed on the second carrier C2. In some embodiments, the second debonding layer DB2 is formed between the second carrier C2 and the backside of each of the first and second semiconductor chips 101 and 201. In some embodiments, the first semiconductor chips 101 and the second semiconductor chips 201 are arranged alternately on the second debonding layer DB2. Next, the first and second semiconductor chips 101 and 201 are encapsulated with a first encapsulation layer E1. A second redistribution layer structure RDL2 is then formed on the first encapsulation layer E1.

In some embodiments, the smallest feature dimension of the second redistribution layer structure RDL2 can be less than the smallest feature dimension of the first redistribution layer structure RDL1. In alternative embodiments, the smallest feature dimension of the second redistribution layer structure RDL2 can be substantially the same as or greater than the smallest feature dimension of the first redistribution layer structure RDL1 as is beneficial.

Figure 2H:
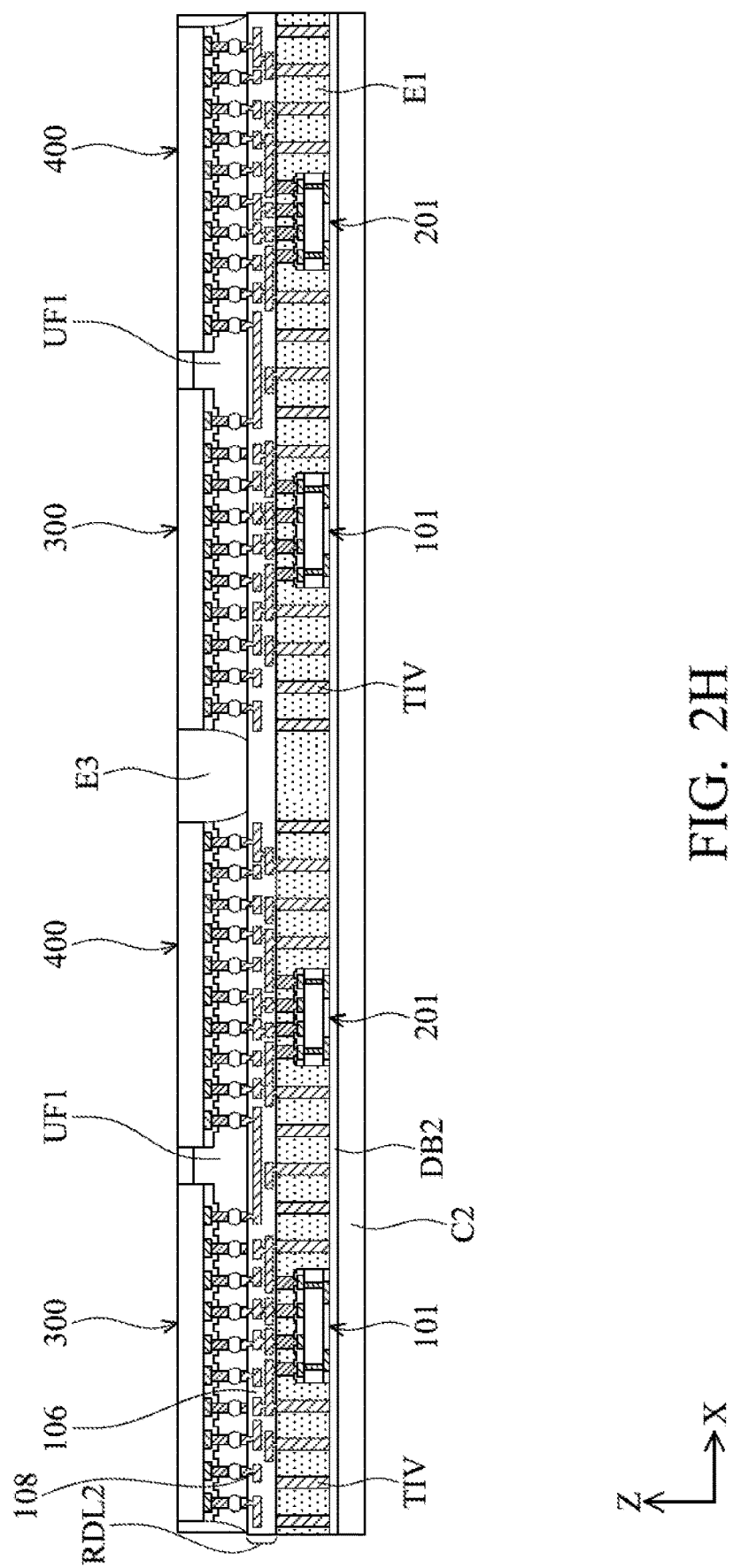

As shown in FIG. 2H, third and fourth semiconductor chips 300 and 400 are placed on and bonded to the second redistribution layer structure RDL2. In some embodiments, the third semiconductor chips 300 and the fourth semiconductor chips 400 are arranged alternately on the second redistribution layer structure RDL2. In some embodiments, the third semiconductor chips 300 respectively correspond to the first semiconductor chips 101, and the fourth semiconductor chips 400 respectively correspond to the second semiconductor chips 201.

Thereafter, an underfill layer UF1 is formed to fill or partially fill the space between the second redistribution layer structure RDL2 and each of the third and fourth semiconductor chips 300 and 400. In some embodiments, an encapsulation layer E3 is formed to laterally surround the underfill layer UF1 and the third and fourth semiconductor chips 300, 400.

Figure 2I:
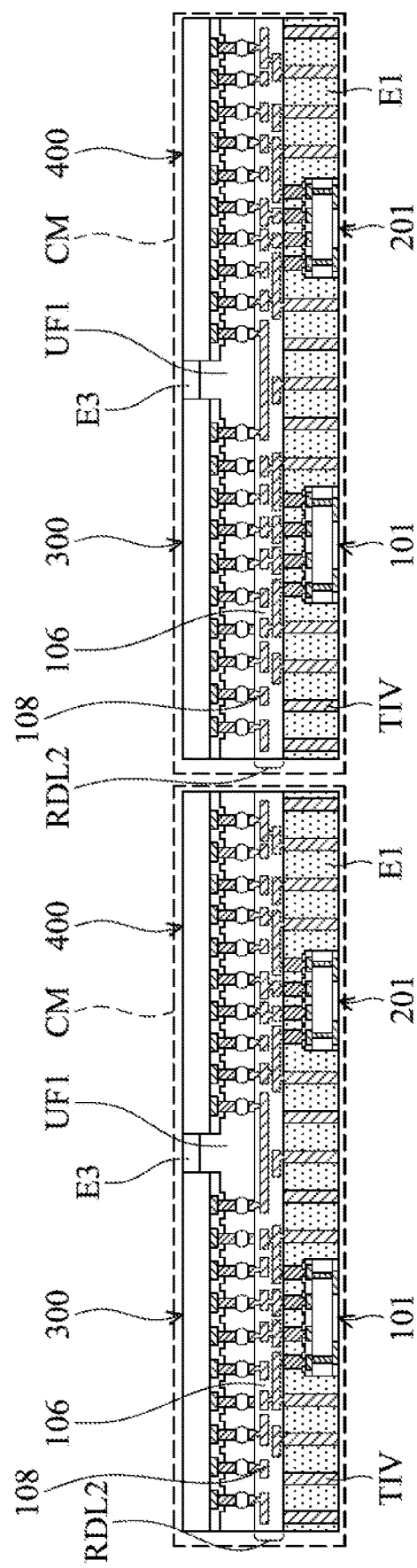

As shown in FIG. 2I, the second carrier C2 is debonded from the backsides of the first and second semiconductor chips 101 and 201. In some embodiments, bumps may be formed at the backsides of the first and second semiconductor chips 101 and 201 and bonded to the backside pads. A singulation process is then performed to separate chip modules CM from each other. In at least one embodiment, the edges of third and fourth semiconductor chips 300 and 400 are substantially aligned with the edge of the second redistribution layer structure RDL2.

In some embodiments, each of the chip modules CM includes a second redistribution layer structure RDL2, first and second semiconductor chips 101 and 201 at one side of the second redistribution layer structure RDL2, a first encapsulation layer E1 encapsulating the first and second semiconductor chips 101 and 201, and third and fourth semiconductor chips 300 and 400 at the opposite side of the second redistribution layer structure RDL2. In some embodiments, each of the chip modules CM includes a first encapsulation layer E1 that encapsulates the sidewalls of the first and second semiconductor chips 101 and 201. In some embodiments, each of the chip modules CM includes through integrated fan-out vias TIV and an underfill layer UF1. In some embodiments, the through integrated fan-out vias TIV penetrates through the first encapsulation layer E1 and aside and/or between the first and second semiconductor chips 101 and 201, and the underfill layer UF1 is formed to fill the space between the second redistribution layer structure RDL2 and each of the third and fourth semiconductor chips 300 and 400. In some embodiments, one or more of the first and second semiconductor chips 101, 201 are not present.

Figure 2J:
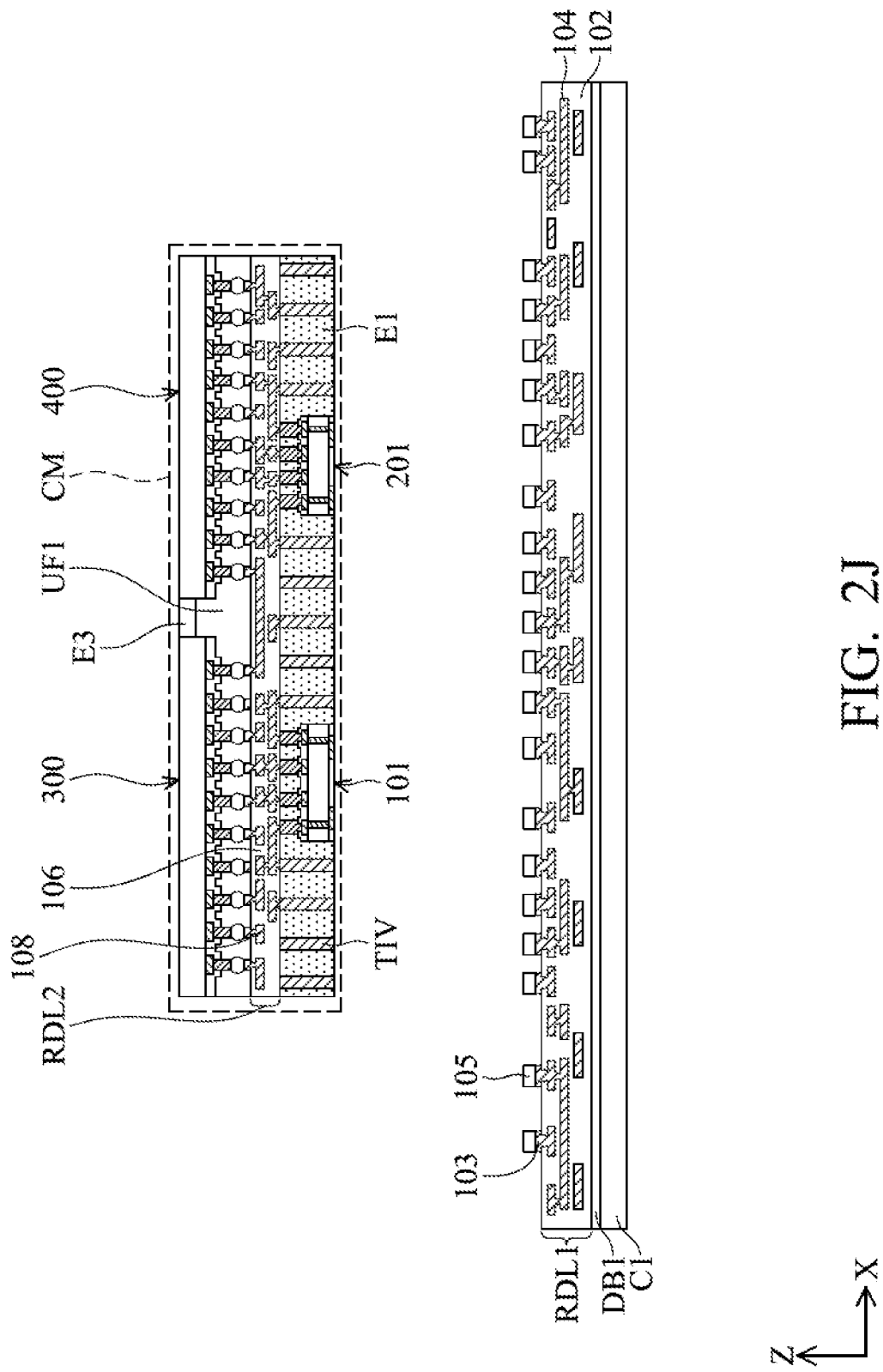
Figure 2K:
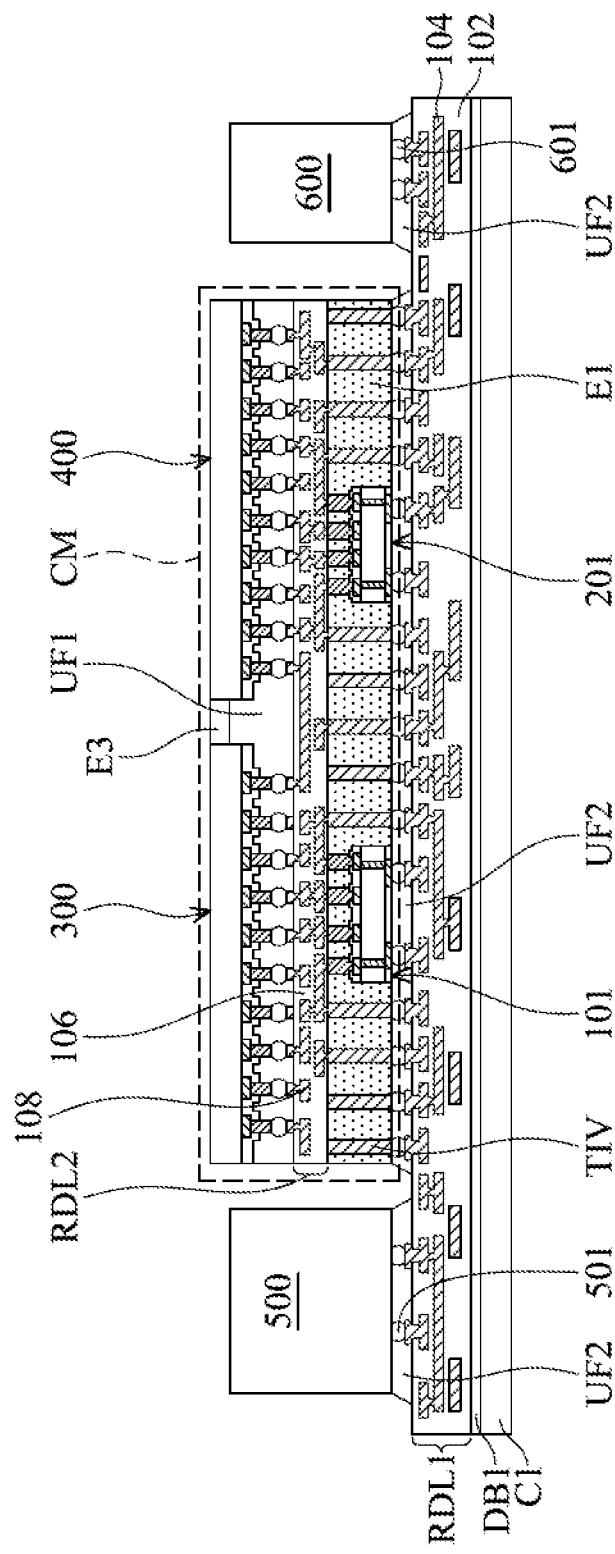

Referring to FIG. 2J and FIG. 2K, one chip module CM is placed on and bonded to a first side of the first redistribution layer structure RDL1. In some embodiments, the chip module CM is bonded to the first redistribution layer structure RDL1 with the backsides of the first and second semiconductor chips 101 and 201 being in physical contact with the first redistribution layer structure RDL1. In some embodiments, the backside pads of the first and second semiconductor chips 101 and 201 and the through integrated fan-out vias TIV of the chip module CM are electrically connected to the first redistribution layer structure RDL1 through the corresponding bumps 105.

In some embodiments, when the chip module CM is placed on and bonded to the first redistribution layer structure RDL1, fifth and sixth semiconductor chips 500 and 600 are placed on and bonded to the first redistribution layer structure RDL1 through the bumps 501 and 601 thereof, as shown in FIG. 2K, corresponding to operation 3300 of FIG. 3.

Thereafter, an underfill layer UF2 is formed to fill the space between the first redistribution layer structure RDL1 and each of the chip module CM, the fifth semiconductor chip 500 and the sixth semiconductor chip 600.

Figure 2L:
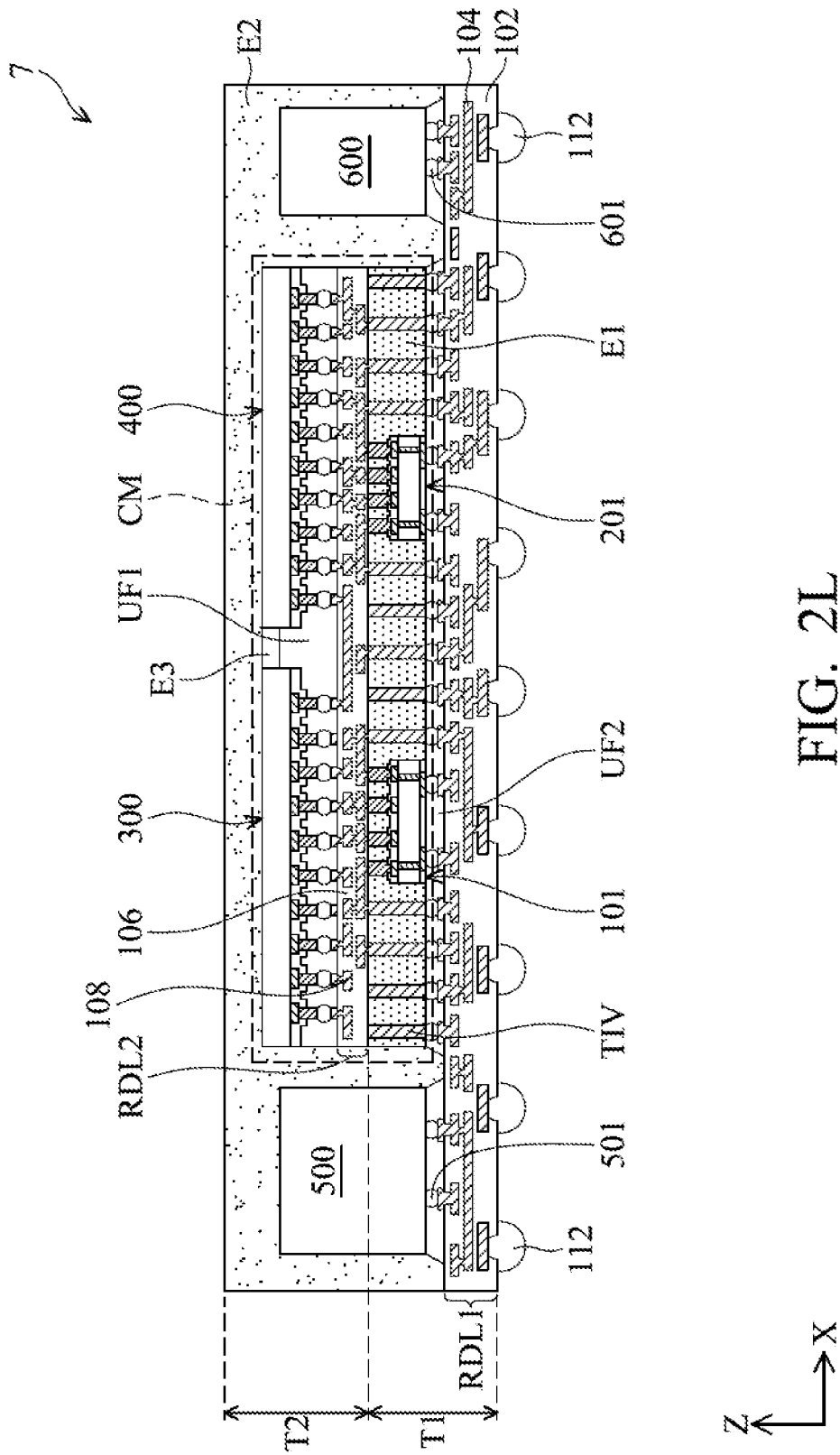

Referring to FIG. 2L, the chip module CM and the fifth and sixth semiconductor chips 500 and 600 are encapsulated with a second encapsulation layer E2. In some embodiments, the second encapsulation layer E2 is formed over the first redistribution layer structure RDL1 to encapsulate or surround the sidewalls and tops of the chip module CM and the fifth and sixth semiconductor chips 500 and 600. The first and second encapsulation layers E1 and E2 can include the same or different materials.

Thereafter, bumps 112 are placed on a second side of the first redistribution layer structure RDL1 opposite to the first side and bonded to the connecting pads of the first redistribution layer structure RDL1, corresponding to operation 3400 of FIG. 3. A multi-chip wafer level package 7 is thus completed. In some embodiments, the multi-chip wafer level package 7 is constituted by a first tier T1 and a second tier T2 in physical contact with each other. In some embodiments, the first tier T1 includes the first redistribution layer structure RDL1 and the first and second semiconductor chips 101 and 201 thereon, and the second tier T2 includes the second redistribution layer structure RDL2 and the third and fourth semiconductor chips 300 and 400 thereon.

The above embodiments in which each of the multi-chip wafer level packages has two tiers and each tier has two chips and one redistribution layer structure are provided for illustration purposes, and are not construed as limiting the present disclosure. In some embodiments, more than one redistribution layer structures can be included in at least one of the two tiers. In some embodiments, at least one of the two tiers can be designed to have a single chip or more than two chips as needed.

Figure 4:
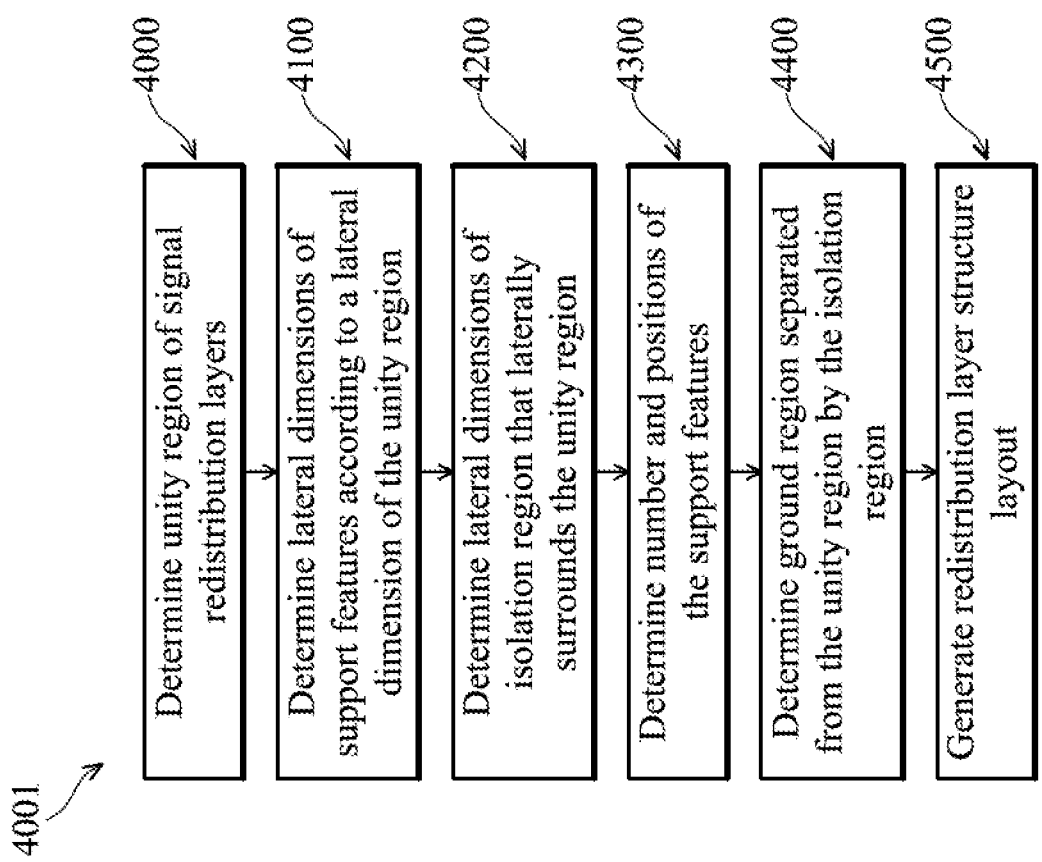
FIG. 4 is a view illustrating a method of determining a signal boundary according to various embodiments of the present disclosure.

FIG. 4 is a flowchart diagram of a method 4001 for generating a layout of a redistribution layer structure, such as the first redistribution layer structure RDL1. In some embodiments, the method 4001 includes a number of operations (4000, 4100, 4200, 4300, 4400 and 4500). The method 4001 will be further described according to one or more embodiments. It should be noted that the operations of the method 4001 may be rearranged or otherwise modified within the scope of the various aspects. It should further be noted that additional processes may be provided before, during, and after the method 4001, and that some other processes may be only briefly described herein.

In operation 4000, a unity region of signal redistribution layers associated with a signal net is determined. For example, two or more signal layout patterns may be associated with the same net name. As shown in FIG. 1F, the signal redistribution layers 124A, 124B, 124C, 124L may be associated with the same net name of the signal net. The unity region in the example of FIG. 1F may be the signal region 160 having width D160X and length D160Y. The unity region may be rectangular or square.

In operation 4100, lateral dimensions (e.g., the width D150X and the length D150Y) of support features (e.g., the support features 150) are determined according to a lateral dimension of the unity region, vertical dimension of the redistribution layers, or both. In some embodiments, the lateral dimensions of the support features are determined according to a smaller lateral dimension of the unity region. In the example of FIG. 1F, the width D160X may be the smaller lateral dimension of the width D160X and the length D160Y. As such, the lateral dimensions of the support features may be determined according to the width D160X. In some embodiments, the lateral dimensions of the support features are determined as less than or equal to ¼ of the smaller lateral dimension (e.g., ¼ of the width D160X). The width D150X may be less than or equal to ¼ of the width D160X, for example. In some embodiments, the lateral dimensions of the support features are determined according to thickness of the redistribution layers. For example, the width D150X may be greater than or equal to 0.4 times the thickness of the redistribution layers 104A, 104B, 104C, 104L.

In operation 4200, lateral dimensions of an isolation region that laterally surrounds the unity region are determined. In some embodiments, the lateral dimensions (e.g., the width D) of the isolation region are determined based on the lateral dimensions of the support features. For example, the width D may be greater than the width D150X. In some embodiments, the width D is greater than the width W150X by a selected amount, such as at least 10 nanometers, at least 100 nanometers, or another suitable amount.

In operation 4300, number and positions of the support features may be determined. For example, number and positions of the support features 150P in the isolation region 180 and number and positions of the support features 150S in the signal region 160 may be determined. The positions may be determined based on a selected spacing distance that is beneficial for avoiding sagging in the polymer layers.

In operation 4400, position and size are determined of a ground region that is separated from the unity region by the isolation region. For example, the ground region 170 may laterally surround the signal region 160, and may be separated from the signal region 160 by the isolation region 180. The position of the ground region 170 may be determined as bordering the isolation region 180, such that once the lateral dimensions D of the isolation region 180 are determined, the ground region 170 may be positioned to be separated from the signal region 160 by the lateral dimension D. Size of the ground region 170 may be a size beneficial for performance of the multi-chip WLP 1 or 2.

In operation 4500, a redistribution layer structure layout is generated. For example, based on the dimensions of the support features 150 and the isolation region 180, layout of the first redistribution layer structure RDL1 may be generated as illustrated in FIG. 1C to FIG. 1E.

In some embodiments, the redistribution layer structure RDL1 is formed (e.g., manufactured) using the redistribution layer structure layout generated using the method 4001 of FIG. 4.

FIG. 5A to FIG. 5D are cross-sectional views of one or more operations of a method of forming a multi-chip package in accordance with various embodiments. The operations shown in FIG. 5A to FIG. 5D may be used to form the multi-chip package 3 of FIG. 1H.

Figure 5A:
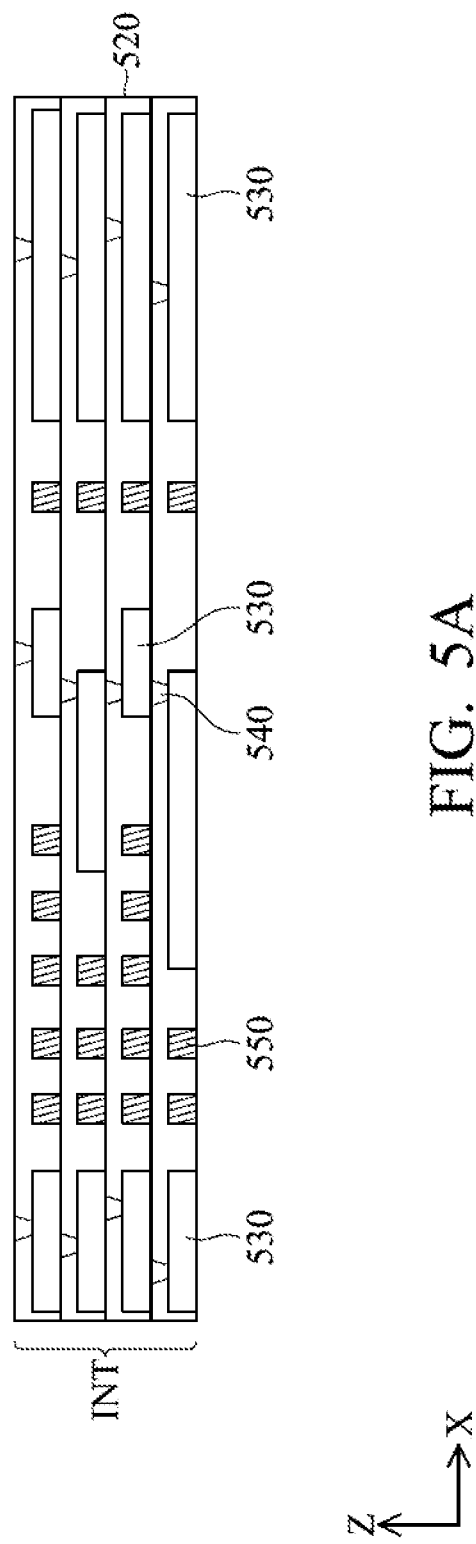
FIGS. 5A-5D are views illustrating a method of forming a multi-chip package in accordance with various embodiments.

In FIG. 5A, an interposer INT is provided. The interposer INT includes dielectric layers 520 and conductive traces 530 embedded therein. In some embodiments, the dielectric layers 520 include silicon dioxide. The conductive traces 530 may include copper, tungsten, other metals, combinations (e.g., alloys or multilayers) thereof, or the like. The interposer INT may include conductive vias 540 for electrically connecting pairs of the conductive traces 530 to each other. The conductive vias 540 may include copper, tungsten, other metals, combinations (e.g., alloys or multilayers) thereof, or the like. In some embodiments, the interposer INT includes support structures 550 similar to the support structures 150 of the redistribution layer structure RDL. In many embodiments, because the dielectric layers 520 are formed of a material (e.g., silicon dioxide) that is more rigid than that of the redistribution layers 104 (e.g., a polymer), the support structures 550 may be omitted in the interposer INT.

Figure 5B:
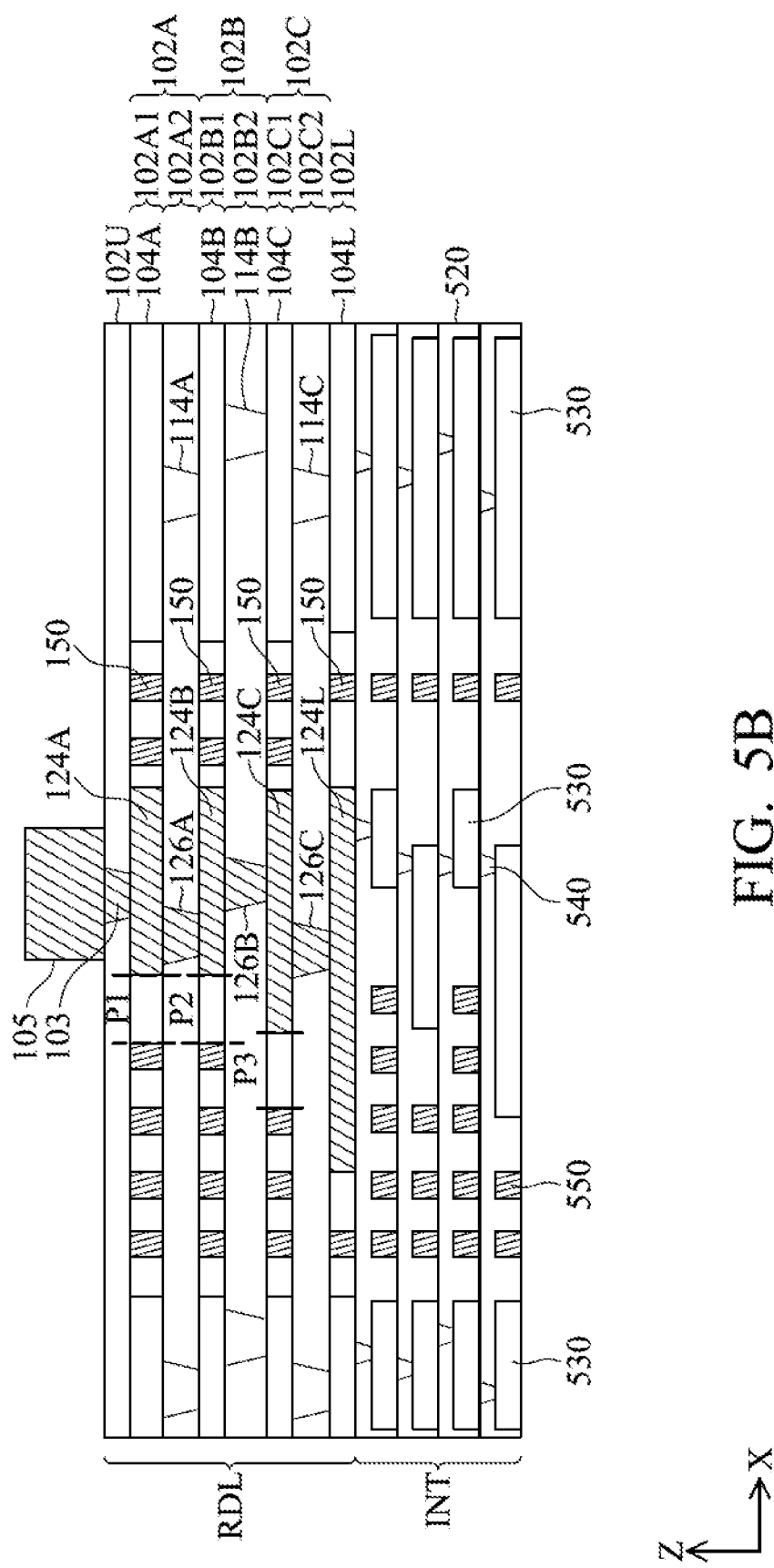

In FIG. 5B, the redistribution layer RDL is formed on the interposer INT. Formation of the redistribution layer RDL is similar to formation of the redistribution layer RDL1 described with reference to FIGS. 2B-2F. In embodiments including the support structures 550 in the interposer INT, the support structures 150 may overlap (e.g., be aligned with or partially aligned with) the support structures 550.

Figure 5C:
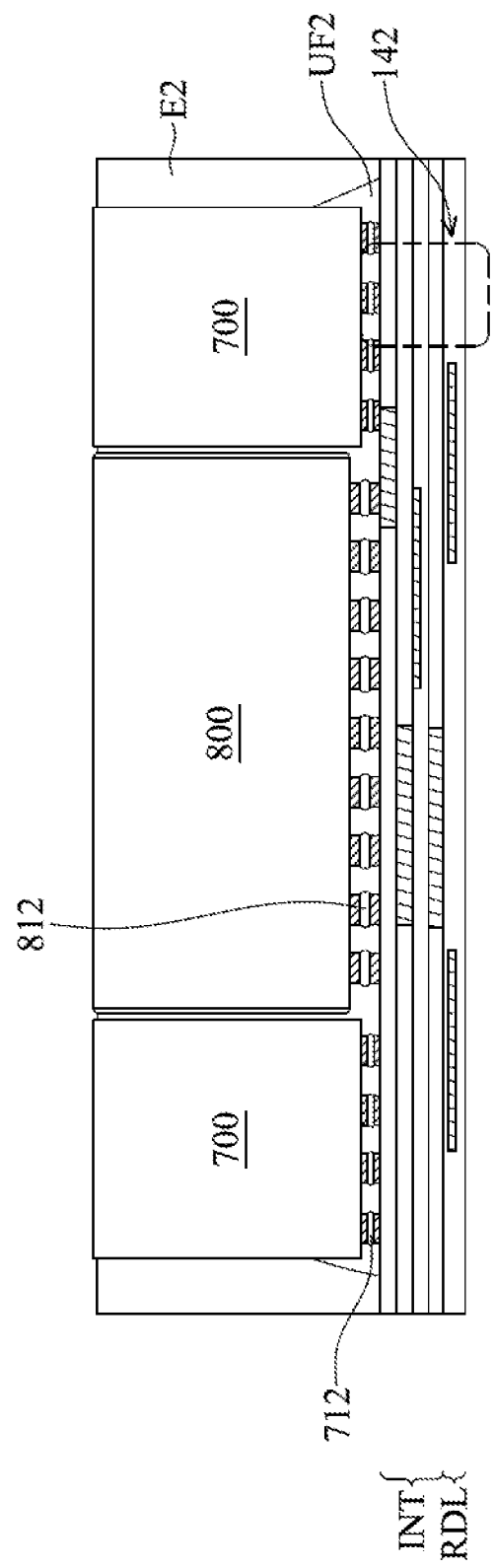

In FIG. 5C, the first and second dies 800, 700 are attached to the interposer INT through the first and second connectors 812, 712. Following attaching of the first and second dies 800, 700, the underfill UF may be formed in spaces between the first die 800, the second dies 700, the first connectors 812, the second connectors 712 and the interposer INT. The first and second dies 800, 700 may then be encapsulated by the second encapsulation layer E2. The structure illustrated in FIG. 5C may be referred to as a chip-on-wafer (CoW) structure.

Figure 5D:
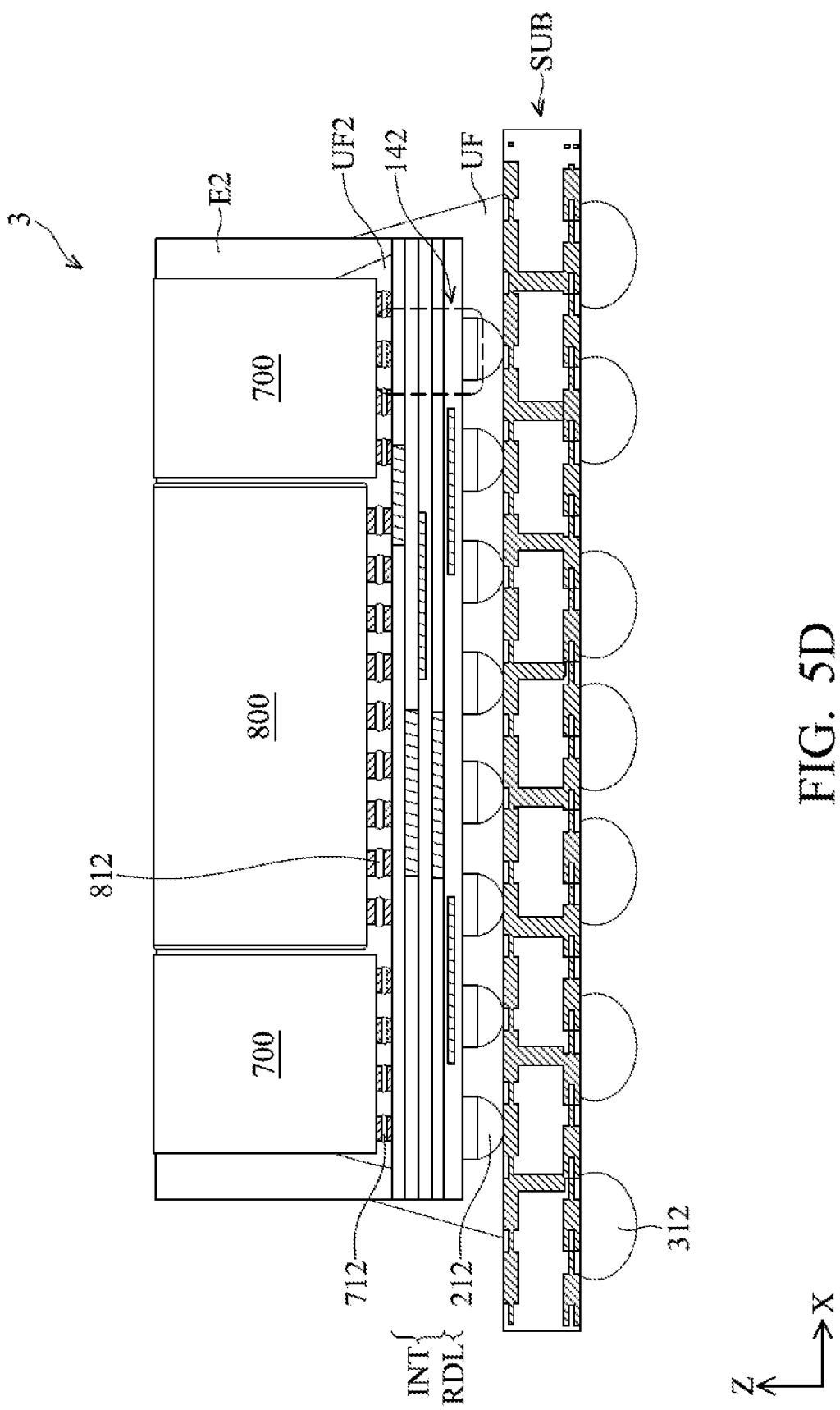

In FIG. 5D, the CoW structure is attached to the substrate SUB by the third connectors 212, and the fourth connectors 312 are formed on the substrate SUB. The structure illustrated in FIG. 5C may be a chip-on-wafer-on-silicon (CoWoS) structure, and may be substantially the same as the multi-chip package 3 shown in FIG. 1H.

Embodiments may provide advantages. By positioning the isolation region 180 between the signal redistribution lines 124A, 124B, 124C, 124L in the signal region 160 and the redistribution lines 104A, 104B, 104C, 104L in the ground region 170, capacitive coupling between the signal redistribution lines 124A, 124B, 124C, 124L and the redistribution lines 104A, 104B, 104C, 104L can be reduced or eliminated, which improves insertion loss at high frequencies. Positioning the support structures 150 reduces process variation, such as sagging of the polymer layers 120A, 120B, 120C, 120L without incurring a penalty to insertion loss.

In accordance with at least one embodiment, a device includes a semiconductor chip and a redistribution layer (RDL) structure connected to the semiconductor chip. The redistribution layer structure comprises a first region including: a first bump connected to the semiconductor chip; a second bump; and a plurality of first redistribution layers connected between the first bump and the second bump. The RDL structure includes a second region laterally surrounding the first region, the second region including a plurality of second redistribution layers. The RDL structure includes an isolation region laterally separating the plurality of first redistribution layers from the plurality of second redistribution layer. The isolation region includes at least one region that is straight, continuous, extends from an upper surface of the redistribution layer structure to a lower surface of the first redistribution layer structure, and has at least a selected width.

In accordance with at least one embodiment, a device includes a redistribution layer structure, which includes: a second bump; a first dielectric layer on the second bump; a second dielectric layer on the first dielectric layer; a first bump on the second dielectric layer; a first signal redistribution layer in the first dielectric layer, wherein the first signal redistribution layer is nearest the second bump of signal redistribution layers of the redistribution layer structure; a second signal redistribution layer in the second dielectric layer and overlapping the first signal redistribution layer; a first ground redistribution layer in the first dielectric layer, laterally surrounding the first signal redistribution layer, and laterally separated from the first signal redistribution layer by an isolation region, wherein sidewalls of the first signal redistribution layer are laterally spaced from the first ground redistribution layer; and a first support feature in the first dielectric layer in the isolation region. The device includes a through integrated fan-out via connected to the first bump.

In accordance with at least one embodiment, a method includes: forming a redistribution layer structure including a signal region, a ground region laterally surrounding the signal region, and an isolation region positioned between the signal region and the ground region. The signal region includes at least two signal redistribution layers that are vertically separated from each other and overlap each other. The ground region includes at least two ground redistribution layers that are vertically separated from each other and overlap each other. The isolation region includes at least two support features that are vertically separated from each other. The isolation region includes at least one region that is straight, continuous, extends from an upper surface of the redistribution layer structure to a lower surface of the first redistribution layer structure, and has at least a selected width. The method includes forming a first bump on a first side of the signal region, and forming a second bump on a second side of the signal region opposite the first side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a semiconductor chip; and
   a redistribution layer structure connected to the semiconductor chip, the redistribution layer structure including:
   a first region including:
   a first bump connected to the semiconductor chip;
   a second bump; and
   a plurality of first redistribution layers connected between the first bump and the second bump;
   a second region laterally surrounding the first region, the second region including a plurality of second redistribution layers; and
   an isolation region laterally separating the plurality of first redistribution layers from the plurality of second redistribution layers, wherein the isolation region includes at least one region that is straight, continuous, extends from an upper surface of the redistribution layer structure to a lower surface of the redistribution layer structure, and has at least a selected width,
   wherein the isolation region includes a plurality of first support structures positioned between the plurality of first redistribution layers and the plurality of second redistribution layers.

2. The device of claim 1, wherein the first support structures are formed from the same material as at least one of the first redistribution layers.

3. The device of claim 1, wherein a signal region includes a plurality of second support structures positioned between the first support structures and at least one of the plurality of first redistribution layers.

4. The device of claim 1, wherein the plurality of first support structures have a first lateral dimension that is in a range of about 0.4 times thickness of one of the plurality of first redistribution layers to about ¼ of width of the first region.

5. The device of claim 4, wherein the first region has a rectangular profile, and the width of the first region is the shorter side of the rectangular profile.

6. The device of claim 4, wherein the plurality of first support structures have a second lateral dimension that is in a range of about 1 times to about 3 times the first lateral dimension.

7. The device of claim 4, wherein the isolation region has a third lateral dimension that is greater than the first lateral dimension.

8. A device, comprising:
   a redistribution layer structure including:
   a second bump;
   a first dielectric layer on the second bump;
   a second dielectric layer on the first dielectric layer;
   a first bump on the second dielectric layer;
   a first signal redistribution layer in the first dielectric layer, wherein the first signal redistribution layer is nearest the second bump of signal redistribution layers of the redistribution layer structure;
   a second signal redistribution layer in the second dielectric layer and overlapping the first signal redistribution layer;
   a first ground redistribution layer in the first dielectric layer, laterally surrounding the first signal redistribution layer, and laterally separated from the first signal redistribution layer by an isolation region, wherein sidewalls of the first signal redistribution layer are laterally spaced from the first ground redistribution layer; and
   a first support feature in the first dielectric layer in the isolation region; and
   a through integrated fan-out via connected to the first bump.

9. The device of claim 8, further comprising a second support feature in the first dielectric layer, the second support feature vertically overlapping the second signal redistribution layer.

10. The device of claim 9, wherein the first and second signal redistribution layers are in a signal region, the signal region having a profile that is a unity region including the first and second signal redistribution layers.

11. The device of claim 9, wherein the first support feature, the second support feature, the first signal redistribution layer and the first ground redistribution layer are the same material.

12. The device of claim 11, wherein the first support feature and the second support feature are metal and electrically floating.

13. The device of claim 8, wherein the isolation region has width greater than 1 micrometer.

14. The device of claim 8, further comprising a second support feature in the second dielectric layer, the second support feature and the first support feature having different lateral dimensions from each other.

15. A method, comprising:
    forming a redistribution layer structure including a signal region, a ground region laterally surrounding the signal region, and an isolation region positioned between the signal region and the ground region, wherein:
    the signal region includes at least two signal redistribution layers that are vertically separated from each other and overlap each other;
    the ground region includes at least two ground redistribution layers that are vertically separated from each other and overlap each other; and
    the isolation region includes at least two support features that are vertically separated from each other, the isolation region including at least one region that is straight, continuous, extends from an upper surface of the redistribution layer structure to a lower surface of the redistribution layer structure, and has at least a selected width;
    forming a first bump on a first side of the signal region; and
    forming a second bump on a second side of the signal region opposite the first side.

16. The method of claim 15, further comprising attaching a semiconductor die to the first bump.

17. The method of claim 15, further comprising attaching a through integrated fan-out via to the first bump.

18. The method of claim 15, wherein the at least two support features have a first lateral dimension that is in a range of about 0.4 times thickness of one of the at least two signal redistribution layers to about ¼ of width of the signal region.

19. The method of claim 15, wherein the at least two support features are metal and electrically floating.

20. The method of claim 15, wherein the signal region includes at least one support feature in the same layer as one of the at least two signal redistribution layers.

* * * * *